(12) United States Patent
Chang et al.

(10) Patent No.: US 11,830,864 B2
(45) Date of Patent: Nov. 28, 2023

(54) PHOTONIC SEMICONDUCTOR DEVICE AND METHOD

(71) Applicant: Taiwan Semiconductor Manufacturing Co., Ltd., Hsinchu (TW)

(72) Inventors: Chih-Chieh Chang, Hsinchu (TW); Chung-Hao Tsai, Huatan Township (TW); Chuei-Tang Wang, Taichung (TW); Hsing-Kuo Hsia, Jhubei (TW); Chen-Hua Yu, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/182,477

(22) Filed: Mar. 13, 2023

(65) Prior Publication Data

US 2023/0215853 A1   Jul. 6, 2023

Related U.S. Application Data

(60) Continuation of application No. 17/806,527, filed on Jun. 13, 2022, now Pat. No. 11,605,622, which is a
(Continued)

(51) Int. Cl.
*H01L 25/16* (2023.01)
*H01L 23/48* (2006.01)
(Continued)

(52) U.S. Cl.
CPC ...... *H01L 25/167* (2013.01); *H01L 21/76898* (2013.01); *H01L 23/481* (2013.01); *H01L 23/5226* (2013.01); *G02B 6/12004* (2013.01); *G02B 6/1225* (2013.01); *H01L 21/565* (2013.01); *H01L 23/3157* (2013.01);
(Continued)

(58) Field of Classification Search
None
See application file for complete search history.

(56) References Cited

U.S. PATENT DOCUMENTS

| 2012/0128292 A1 | 5/2012 | Hamamura et al. |
| 2015/0145086 A1 | 5/2015 | Rokuhara et al. |

(Continued)

FOREIGN PATENT DOCUMENTS

| CN | 104656207 A | 5/2015 |
| CN | 105742405 A | 7/2016 |

(Continued)

*Primary Examiner* — Jerry Rahll
(74) *Attorney, Agent, or Firm* — Slater Matsil, LLP

(57) ABSTRACT

A method includes forming multiple photonic devices in a semiconductor wafer, forming a v-shaped groove in a first side of the semiconductor wafer, forming an opening extending through the semiconductor wafer, forming multiple conductive features within the opening, wherein the conductive features extend from the first side of the semiconductor wafer to a second side of the semiconductor wafer, forming a polymer material over the v-shaped groove, depositing a molding material within the opening, wherein the multiple conductive features are separated by the molding material, after depositing the molding material, removing the polymer material to expose the v-shaped groove, and placing an optical fiber within the v-shaped groove.

20 Claims, 28 Drawing Sheets

Related U.S. Application Data continuation of application No. 17/181,279, filed on Feb. 22, 2021, now Pat. No. 11,362,077, which is a division of application No. 16/437,151, filed on Jun. 11, 2019, now Pat. No. 10,930,628.

(60) Provisional application No. 62/690,679, filed on Jun. 27, 2018.

(51) Int. Cl.
| | |
|---|---|
| *H01L 21/768* | (2006.01) |
| *H01L 23/522* | (2006.01) |
| *H01L 23/528* | (2006.01) |
| *H01L 23/31* | (2006.01) |
| *H01L 21/56* | (2006.01) |
| *G02B 6/12* | (2006.01) |
| *G02B 6/122* | (2006.01) |

(52) U.S. Cl.
CPC .. *H01L 23/5283* (2013.01); *H01L 2224/0231* (2013.01); *H01L 2224/02373* (2013.01); *H01L 2224/02381* (2013.01); *H01L 2224/0401* (2013.01)

(56) References Cited

U.S. PATENT DOCUMENTS

| | | |
|---|---|---|
| 2015/0323738 A1 | 11/2015 | Sekiguchi et al. |
| 2016/0181445 A1 | 6/2016 | Assefa et al. |
| 2017/0092626 A1 | 3/2017 | Yuan et al. |
| 2017/0261703 A1 | 9/2017 | Bowen et al. |
| 2019/0317287 A1 | 10/2019 | Raghunathan et al. |

FOREIGN PATENT DOCUMENTS

| | | |
|---|---|---|
| CN | 106558577 A | 4/2017 |
| JP | 2015216169 A | 12/2015 |
| KR | 20120027451 A | 3/2012 |

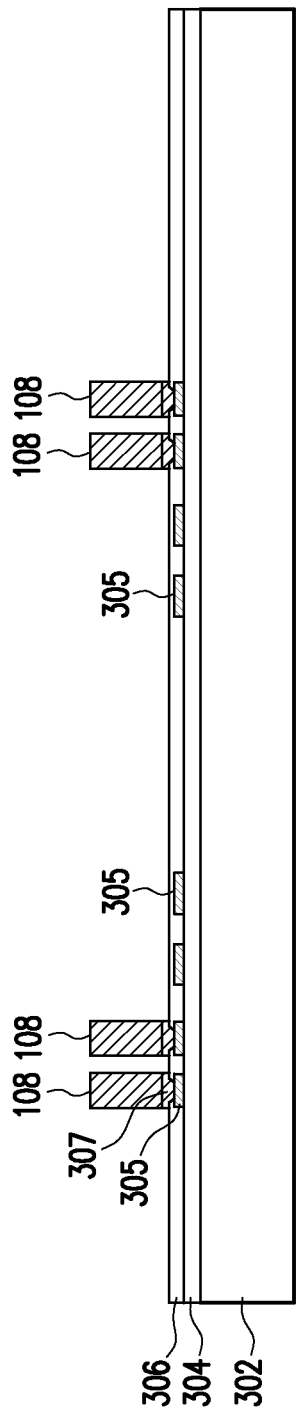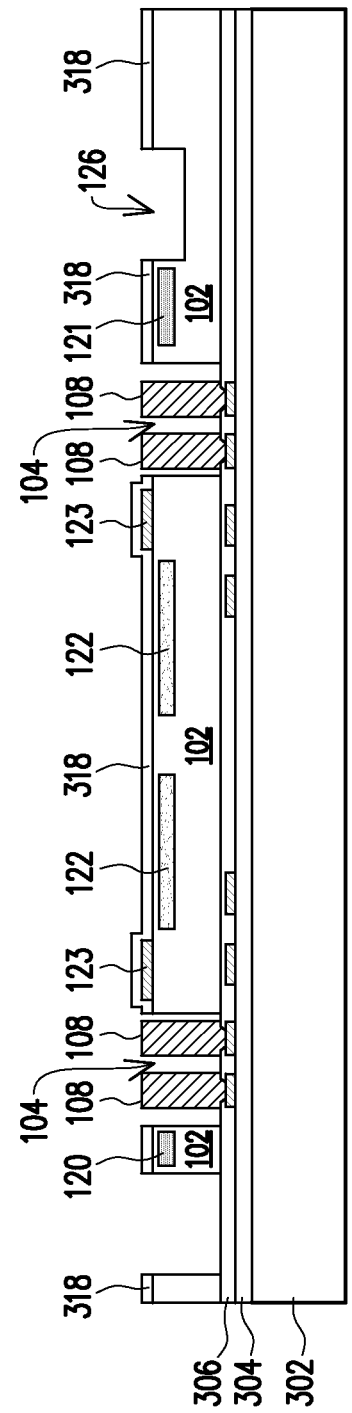
FIG. 3A
FIG. 3B

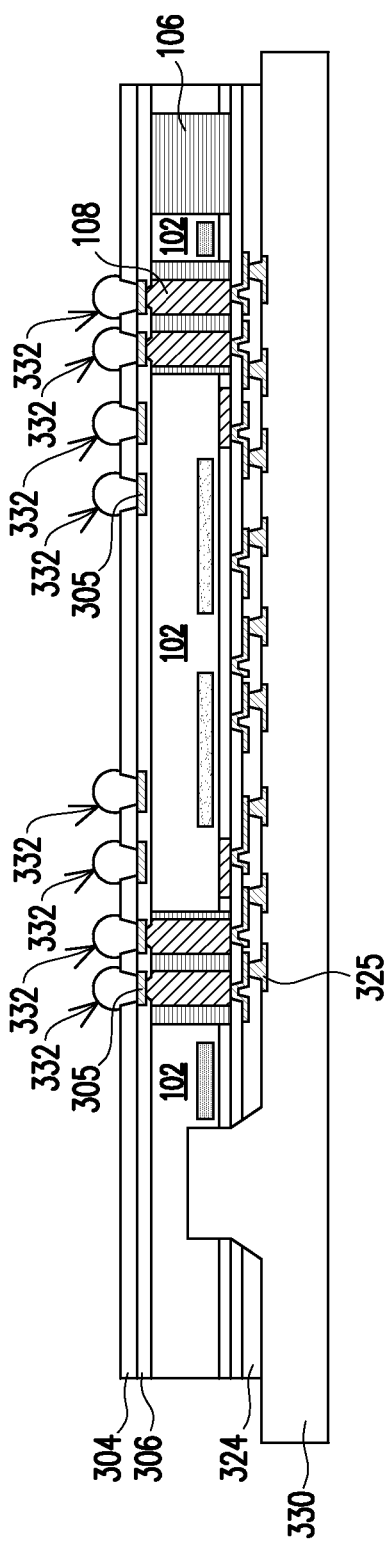
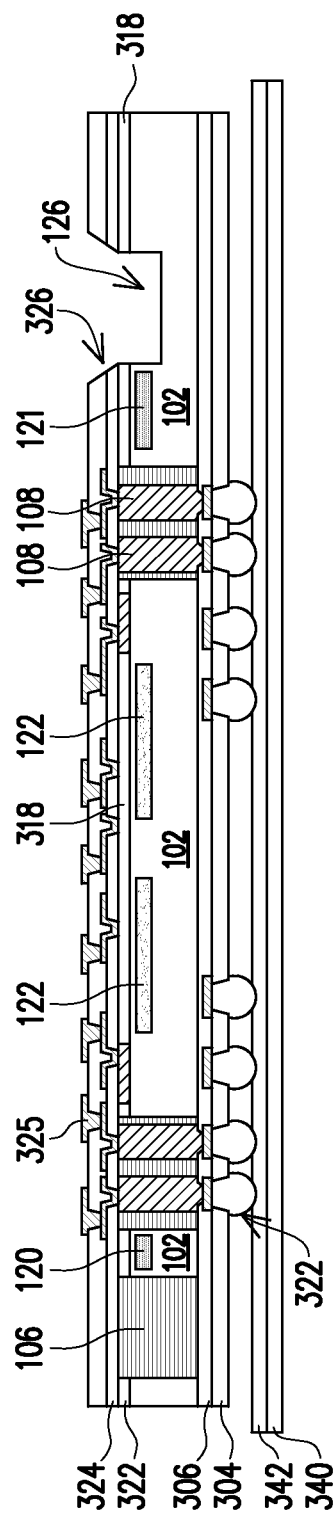
FIG. 3I
FIG. 3J

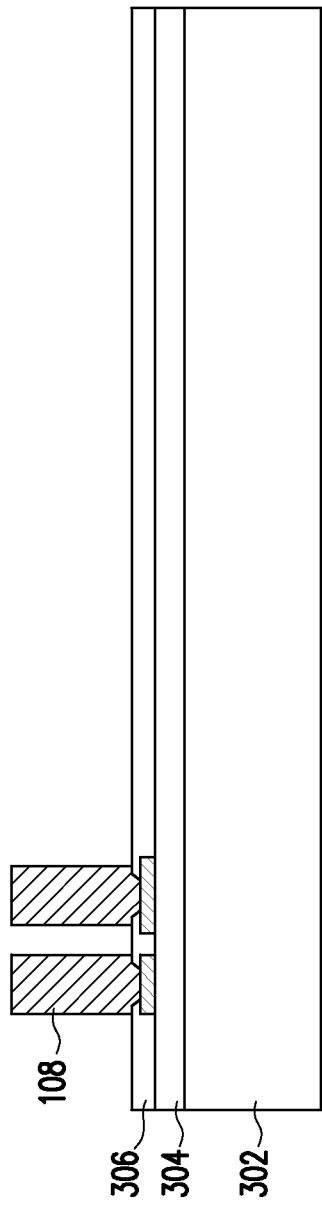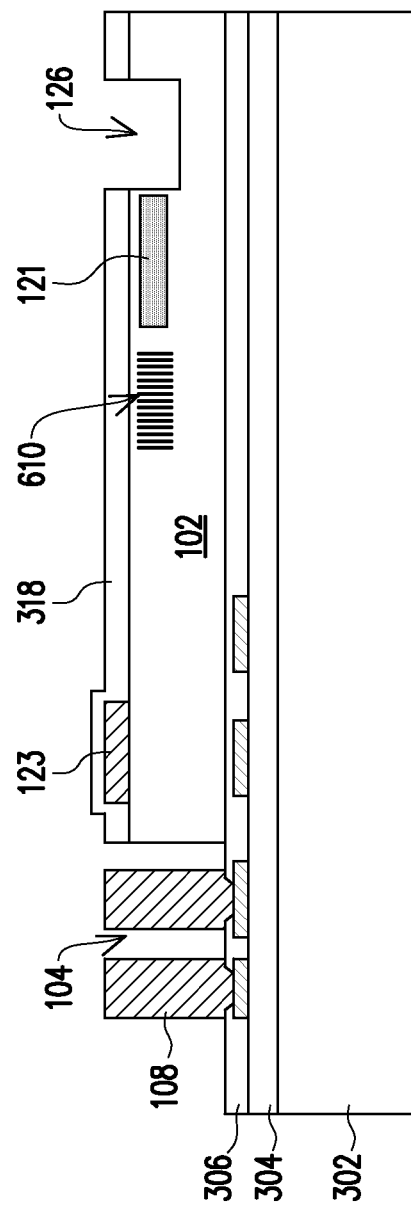

US 11,830,864 B2

PHOTONIC SEMICONDUCTOR DEVICE AND METHOD

PRIORITY CLAIM AND CROSS-REFERENCE

This application is a continuation of U.S. patent application Ser. No. 17/806,527, filed on Jun. 13, 2022, which is a continuation of U.S. patent application Ser. No. 17/181,279, filed on February 22, 2021, now U.S. Pat. No. 11,362,077 issued Jun. 14, 2022, which is a divisional of U.S. patent application Ser. No. 16/437,151, filed on Jun. 11, 2019, now U.S. Pat. No. 10,930,628 issued Feb. 23, 2021, which claims the benefits of U.S. Provisional Application No. 62/690,679, filed on Jun. 27, 2018, each application is hereby incorporated herein by reference in its entirety.

BACKGROUND

Electrical signaling and processing are one technique for signal transmission and processing. Optical signaling and processing have been used in increasingly more applications in recent years, particularly due to the use of optical fiber-related applications for signal transmission.

Optical signaling and processing are typically combined with electrical signaling and processing to provide full-fledged applications. For example, optical fibers may be used for long-range signal transmission, and electrical signals may be used for short-range signal transmission as well as processing and controlling. Accordingly, devices integrating optical components and electrical components are formed for the conversion between optical signals and electrical signals, as well as the processing of optical signals and electrical signals. Packages thus may include both optical (photonic) dies including optical devices and electronic dies including electronic devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A through 3M are cross-sectional views of intermediate steps during a process for forming a photonics system, in accordance with some embodiments.

FIGS. 7A through 7I are cross-sectional views of intermediate steps during a process for forming a photonics system, in accordance with some embodiments.

DETAILED DESCRIPTION

Figure 1:
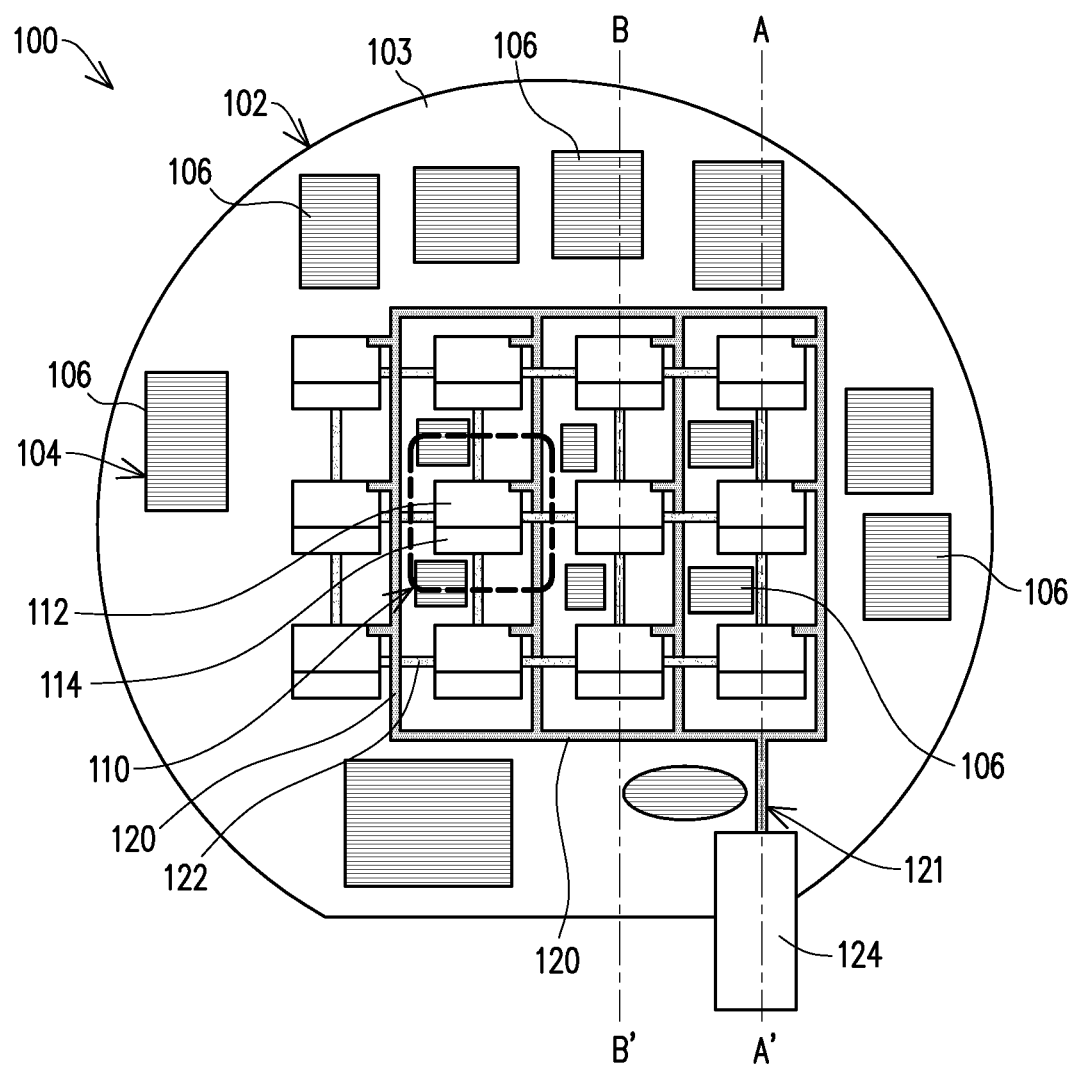
FIG. 1 illustrates a plan view of a photonics system, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Three-dimensional (3D) packages including both optical devices and electrical devices, and the method of forming the same are provided, in accordance with some embodiments. In particular, a photonics system is formed having conductive features for transmitting electrical signals and waveguides for transmitting optical signals. Dies are coupled to the system over an integrated photonic substrate (e.g., a wafer or other substrate having photonic devices) or within openings in the integrated photonic substrate. Through-vias may also be formed within openings in the integrated photonic substrate. A sacrificial material may be used to protect features of the integrated photonic substrate (e.g., grooves for fiber mounting) during processing. The intermediate stages of forming the packages are illustrated, in accordance with some embodiments. Some variations of some embodiments are discussed. Throughout the various views and illustrative embodiments, like reference numbers are used to designate like elements.

The embodiments described herein can allow for improved performance and more efficient manufacture of a photonics system. For example, larger through-vias may be formed to electrically connect the photonics system to another substrate or component. Larger through-vias may be more conductive, which can improve power efficiency, and may have less loss or distortion at higher frequencies, which can improve the signal-to-noise ratio of electrical signals and improve performance of the system at higher frequency operation. Additionally, the process flow described herein can be less prone to process damage when forming features such as grooves for optical fibers. Some embodiments also may provide additional advantages, such as less metal routing required within a photonics system or reduced overall thickness of a photonics system.

Figure 2A:
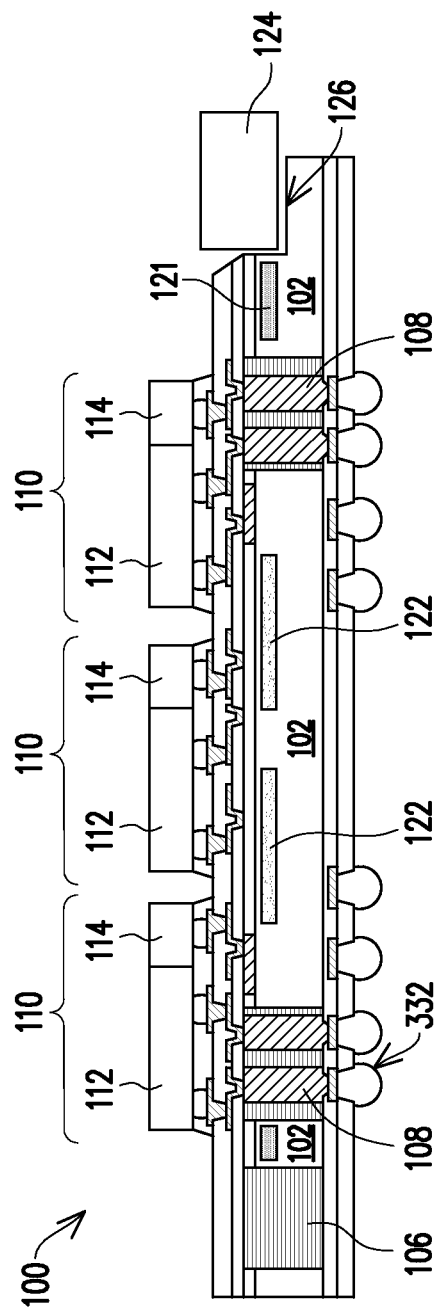
FIGS. 2A through 2B illustrate cross-sectional views of a photonics system, in accordance with some embodiments.
Figure 2B:
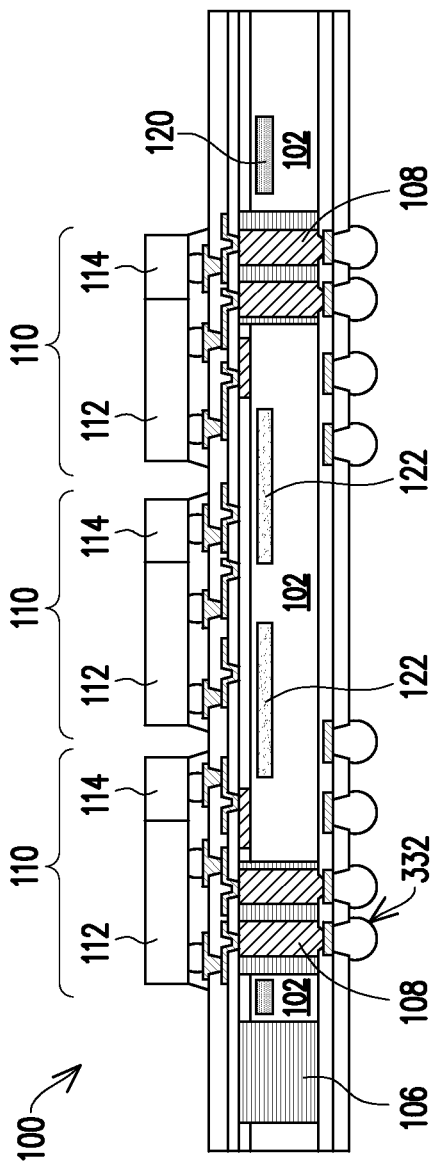

FIG. 1 illustrates a photonics system 100 in accordance with some embodiments. The photonics system 100 is, e.g., a high performance computing (HPC) system, and includes a plurality of sites 110, each of which is a separate computing system (an example site 110 is labeled in FIG. 1, and example sites are labeled in FIGS. 2A-B). Each site 110 includes one or more dies (e.g., dies 112 or 114, described in greater detail below) coupled to an integrated photonic structure (IPS) 102, and each site 110 communicates with other sites 110 using optical networks (e.g., waveguides 120 or 122, described in greater detail below) formed in the IPS 102. FIG. 1 is an illustration of a photonics system 100 having multiple sites 110. FIG. 2A is an illustration of the photonics system 100 along cross-section A-A', and FIG. 2B is an illustration of the photonics system 100 along cross-section B-B'. It should be noted that the cross-sections A-A' and B-B' labeled in FIG. 1 for photonics system 100 are for illustrative purposes, and the structures of photonics system 100 shown in FIGS. 2A-B or other photonics systems described herein may differ. Some features are not labeled in FIG. 1 or 2A-B and are discussed in greater detail below in FIGS. 3A-3M.

The IPS 102 may include a substrate 103 that may be a material such as a glass, ceramic, dielectric, or semiconductor substrate. For example, the substrate 103 may include a bulk semiconductor or the like, which may be doped (e.g., with a p-type or an n-type dopant) or undoped. In some embodiments, the substrate 103 is a wafer, such as a silicon wafer or other type of semiconductor wafer. Other substrate materials, such as a multi-layered or gradient substrate may also be used. In some embodiments, the material of the substrate 103 may include silicon, germanium, a compound semiconductor including silicon carbide, gallium arsenic, gallium phosphide, indium phosphide, indium arsenide, and/or indium antimonide, an alloy semiconductor including SiGe, GaAsP, AlInAs, AlGaAs, GaInAs, GaInP, and/or GaInAsP, the like, or combinations thereof. In the embodiments shown in FIGS. 1 and 2A-B, the substrate 103 is formed from a silicon wafer, e.g., a 12-inch silicon wafer. In this manner, the photonics system 100 may be a System-on-Wafer (SoW). In some embodiments, the IPS 102 may have a thickness between about 100 µm and about 800 µm.

The IPS 102 may include one or more optical networks, which may be, for example, sets of waveguides formed within the IPS 102. In some embodiments, sets of waveguides formed within the IPS 102 carry optical signals and/or optical power between sites 110. The IPS 102 shown in FIG. 1 includes a set of power waveguides (power WGs) 120 and a set of data waveguides (data WGs) 122. In other embodiments, only one set of waveguides or more than two sets of waveguides may be used. In some embodiments, the power WGs 120 carry optical power to the sites 110, which may be in the form of continuous-wave (CW) light. In some embodiments, the data WGs 122 carry optical signals between the sites 110, which may be in the form of light that is modulated or pulsed. In some cases, a waveguide or a set of waveguides may carry both optical power and optical signals. In some embodiments, sets of waveguides (e.g., power WGs 120 or data WGs 122) may also carry optical signals and/or optical power between the IPS 102 and external components. For example, sets of waveguides may be coupled to external components via one or more optical fibers. As shown in FIG. 1, the power WGs 120 are coupled to an optical power source (e.g., an LED, laser, or the like) via a fiber 124. The fiber 124 may be mounted to the IPS 102 by a v-shaped groove 126 (see e.g., FIGS. 2A-B). In some embodiments, the fiber 124 and the power WGs 120 are coupled by a mode converter 121, which may be formed as part of the power WGs 120. The waveguides described herein are examples, and other embodiments may have different waveguides or waveguides having different configurations than shown.

In some embodiments, the waveguides (e.g., 120 or 122) of the IPS 102 are waveguides formed in the substrate 103, such as slab waveguides. For example, the waveguides may be made of silicon surrounded by silicon oxide. In some embodiments, the waveguides may be formed by patterning a silicon substrate 103 such that the waveguides protrude from a top surface of the substrate 103. A silicon oxide may then be formed on the protruding silicon waveguides. The patterning of the substrate 103 may be accomplished with acceptable photolithography and etching techniques. For example, a photoresist may be formed and developed on a front side of the substrate 103. The photoresist may be patterned, and or more etching processes may then be performed using the patterned photoresist as an etching mask. In particular, the front side of the substrate 103 may be etched to form recesses, with the remaining unrecessed portions of the substrate 103 forming the silicon waveguides. Waveguide features such as mode couplers (e.g., mode coupler 121), grating couplers, or other features may be formed in the same steps or using separate photolithographic or etching steps. The etching processes may include one or more anisotropic wet or dry etch processes. The silicon waveguides may then be covered with silicon oxide, which may be a thermal oxide or an oxide formed by a process such as PVD, CVD, flowable CVD, the like, or a combination. Other techniques of forming waveguides may also be used. It should be appreciated that the dimensions of the waveguides depend on the application. In some embodiments, the silicon waveguides have a width between about 300 nm and about 700 nm, such as about 500 nm, and a height between about 100 nm and about 500 nm, such as about 200 nm.

The IPS 102 also includes integrated photonic devices (not independently shown in FIG. 1 or 2A-B) that interact with, control, or sense the optical signals transmitted through the waveguides. These integrated photonic devices may include devices such as optical modulators (e.g., modulators 210A-B shown in FIG. 4), photodetectors (e.g., photodetectors 212A-B shown in FIG. 4), and the like. For example, an optical modulator may be formed and used to modulate the continuous light from the power WG 120 into modulated light that is transmitted by the data WG 122. As another example, a photodetector may be formed and used to sense the modulated light from the data WG 122. Additionally, integrated electronic devices such as transistors, diodes, capacitors, resistors, metal routing, and the like may also be formed within the IPS 102, and may be coupled to the integrated photonic devices within the IPS 102. In this manner, the IPS 102 may include one or more photonic integrated circuits. In some embodiments, each site 110 may include integrated photonic devices or integrated electronic devices. The integrated photonic devices or integrated electronic devices may be formed in the IPS 102 (e.g., in the substrate 103) using suitable techniques as known in the art.

In some embodiments, the photonics system 100 also includes through-vias (TVs) 108 that extend through the IPS 102, connecting electrical features from one side of the IPS 102 to the other side of the IPS 102. The formation of the TVs 108 is described in greater detail in FIGS. 3A-C. In some embodiments, one or more openings (e.g., openings 104 shown in FIGS. 3B-C) are formed in the IPS 102 such that one or more TVs 108 extend through each of the openings. In some embodiments, the openings are formed in the IPS 102 using suitable photolithography and etching techniques. In some embodiments, the openings may a have lateral dimensions between about 100 µm and about 500 µm. The TVs 108 may also be surrounded by a molding compound 106. In some embodiments, the molding compound 106 may be a material such as an encapsulant, resin, polymer, oxide, nitride, another dielectric material, or the like. In some embodiments, the material of the molding compound 106 is chosen such that the Coefficient of Thermal Expansion (CTE) of the molding compound 106 is about equal to the CTE of the material of the substrate 103 or of the package substrate 350 (see FIG. 3M). In some embodiments, the CTE of the molding compound 106 is between about 5 ppm/° C. and about 30 ppm/° C., such as about 15 ppm/° C.). In some cases, by forming openings in the IPS 102 for multiple TVs 108, the TVs 108 may be formed having a larger size than, for example, forming individual openings through the IPS 102 for individual vias. The use of larger TVs 108 may allow for improved electrical performance (e.g., conduction, current load, high-frequency performance, etc.) of the photonics system 100.

Each site 110 of the photonics system 100 may include one or more dies, which may include processor dies, memory dies, electronic integrated circuits (EIC), the like, or a combination. For example, as shown in FIGS. 1 and 2A-B, a site 110 includes a processor die 112 and an EIC 114, though sites may include more than one processor die 112 or EIC 114 in other embodiments. The processor die 112 may be a central processing unit (CPU), graphics processing unit (GPU), application-specific integrated circuit (ASIC), or the like. The processor die 112 may also include memory, such as volatile memory such as dynamic random-access memory (DRAM), static random-access memory (SRAM), or the like. In some cases, a site 110 may include separate dies for processing and for memory. For clarity, dies for processing, dies for memory, dies having both processing and memory, and combinations of such dies are referred to as "processor dies 112" herein.

In some embodiments, the EIC die 114 may include a CPU and may include a controlling circuit for controlling the operation of the photonic devices associated with the site 110. The EIC die 114 may communicate with photonic devices of the IPS 102 using electrical signals. In some embodiments, the EIC 114 includes the circuits for processing electrical signals received from photonic devices, such as electrical signals received from a photodetector (e.g., photodetectors 212A-B in FIG. 4). For example, the EIC 114 may include controllers, transimpedance amplifiers, and the like. The EIC 114 may be communicatively coupled to one or more processor dies 112. In some cases, the EIC 114 controls high-frequency signaling of a photonic device according to electrical signals (digital or analog) received from a processor die 112. In some embodiments, functions of an EIC 114 may be part of a processor die 112, or functions of a processor die 112 may be part of an EIC 114, or a processor die 112 and an EIC 114 may be combined together as a single die.

Figure 3C:
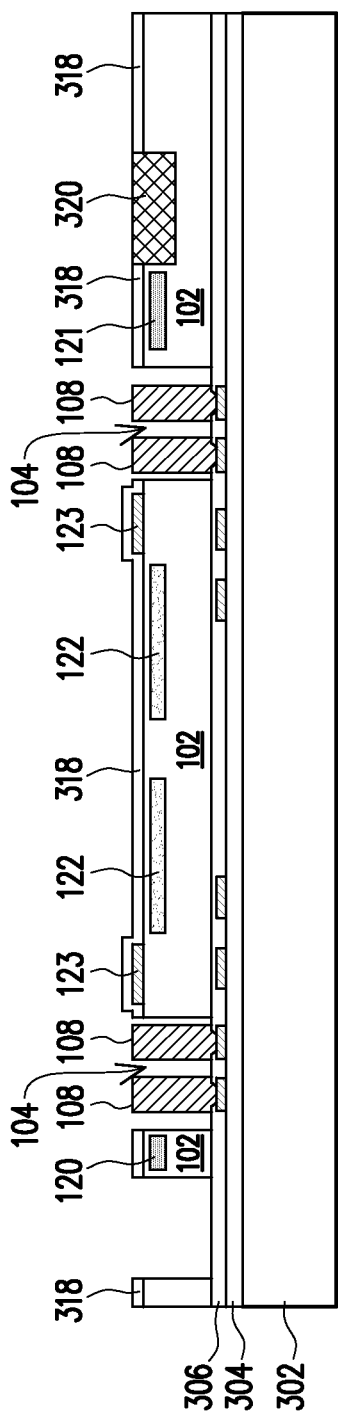

Turning to FIGS. 3A-M, cross-sectional views of intermediate steps in the formation of a photonics system 300 (see FIG. 3M) are shown, according to some embodiments. The photonics system 300 may be similar to the photonics system 100 shown in FIG. 1 or 2A-B. In FIG. 3A, a redistribution layer (RDL) 305 is formed over a carrier substrate 302, and then through-vias (TVs) 108 are formed over the RDL 305. The carrier substrate 302 may include, for example, silicon based materials, such as a glass material or silicon oxide, or other materials, such as aluminum oxide, metals, ceramics, combinations of these, or the like. In some embodiments, a release layer (not shown) may be formed over the carrier substrate 302.

Referring to FIG. 3A, a dielectric layer 304 is formed over the carrier substrate 302. The dielectric layer 304 may be formed from one or more suitable dielectric materials such as silicon oxide, silicon nitride, low-k dielectrics such as carbon doped oxides, extremely low-k dielectrics such as porous carbon doped silicon dioxide, a polymer, combinations of these, or the like. In some embodiments, the dielectric layer 304 may be polybenzoxazole (PBO), although any suitable material, such as polyimide or a polyimide derivative, may be utilized. The dielectric layer 304 may be formed by a process such as spin-coating, lamination, CVD, the like, or a combination thereof. The dielectric layer 304 may have a thickness between about 5 μm and about 25 μm, such as about 7 μm, although any suitable thickness may be used.

In an embodiment, the RDL 305 may be formed by initially forming a seed layer (not shown) of one or more layers of titanium, copper, or a titanium copper alloy through a suitable formation process such as PVD, CVD, sputtering, or the like. The seed layer is formed over the dielectric layer 304. A photoresist (also not shown) may then be formed to cover the seed layer and then be patterned to expose those portions of the seed layer that are located where the RDL 305 will subsequently be formed. Once the photoresist has been formed and patterned, a conductive material may be formed on the seed layer. The conductive material may be a material such as copper, titanium, tungsten, aluminum, another metal, a combination, or the like. The conductive material may be formed through a deposition process such as electroplating or electroless plating, or the like. However, while the material and methods discussed are suitable to form the conductive material, these materials are merely exemplary. Any other suitable materials or any other suitable processes of formation, such as CVD or PVD, may alternatively be used to form the RDL 305. Once the conductive material has been formed, the photoresist may be removed through a suitable removal process such as ashing or chemical stripping. Additionally, after the removal of the photoresist, those portions of the seed layer that were covered by the photoresist may be removed through, for example, a suitable wet etch process or dry etch process, which may use the conductive material as an etch mask. The remaining portions of the seed layer and conductive material form the RDL 305.

A dielectric layer 306 is then formed over the dielectric layer 304 and the RDL 305. The dielectric layer 306 may be a material similar to that of dielectric 304, and may be formed in a similar manner. The dielectric layer 306 may have a thickness between about 5 μm and about 25 μm, such as about 7 μm, although any suitable thickness may be used. The dielectric layer 306 may then be patterned to expose portions of the RDL 305 over which the TVs 108 are subsequently formed. The dielectric layer 306 may be patterned using suitable photolithographic and etching techniques, such as forming a photoresist over the dielectric layer 306, patterning the photoresist, and then using the patterned photoresist as an etch mask to etch the dielectric layer 306. A suitable wet etch or dry etch may be used.

In an embodiment, the TVs 108 may be formed by initially forming a seed layer 307 of one or more layers of titanium, copper, or a titanium copper alloy through a suitable formation process such as PVD, CVD, sputtering, or the like. The seed layer 307 is formed over the dielectric layer 306 and exposed portions of the RDL 305. A photoresist (also not shown) may then be formed to cover the seed layer 307 and then be patterned to expose those portions of the seed layer 307 that are located where the TVs 108 will subsequently be formed. Once the photoresist has been formed and patterned, a conductive material may be formed on the seed layer. The conductive material may be a material such as copper, titanium, tungsten, aluminum, another metal, a combination, or the like. The conductive material may be formed through a deposition process such as electroplating or electroless plating, or the like. However, while the material and methods discussed are suitable to form the conductive material, these materials are merely exemplary. Any other suitable materials or any other suitable processes of formation, such as CVD or PVD, may alternatively be used to form the TVs 108. Once the conductive material has been formed, the photoresist may be removed through a suitable removal process such as ashing or chemical stripping. Additionally, after the removal of the photoresist, those portions of the seed layer 307 that were covered by the photoresist may be removed through, for example, a suitable wet etch process or dry etch process, which may use the conductive material as an etch mask. The remaining portions of the seed layer 307 and conductive material form the TVs 108. The TVs 108 may have a width between about 100 μm and about 500 μm, such as about 250 μm, or may have a height between about 100 μm and about 500 μm, such as about 250 μm, although any suitable dimensions may be used.

Turning to FIG. 3B, the IPS 102 is placed on the dielectric layer 306. In some embodiments, the IPS 102 is mounted to the dielectric layer 306 using an adhesive layer (not shown) disposed between the IPS 102 and the dielectric layer 306. As shown in FIG. 3B, each opening 104 in the IPS 102 is aligned to one or more TVs 108. The IPS 102 may include features described previously, such as power WGs 120, data WGs 122, and mode converters 121. The IPS 102 shown in FIG. 3B also includes contact pads 123, which may provide electrical connection to features (e.g., photonic devices) formed in the IPS 102. In some cases, vias may be present that make electrical connection between contact pads 123 of the IPS 102 and overlying conductive features or routing (e.g., RDL 323 shown in FIG. 3G). For clarity, all suitable combinations of contact pads, vias, or similar features are referred to as contact pads 123. The IPS 102 may also include other features not shown, such as photonic devices, metal routing, etc.

In some embodiments, a protection layer 318 is formed over the IPS 102. The protection layer 318 may be formed over the IPS 102 prior to placement on the dielectric layer 306 or after the IPS 102 has been placed on the dielectric layer 306. The protection layer 318 may be formed from one or more suitable dielectric materials such as silicon oxide, silicon nitride, a polymer, combinations of these, or the like. The protection layer 318 may be formed by a process such as spin-coating, lamination, CVD, the like, or a combination thereof. The protection layer 318 may have a thickness between about 5 μm and about 25 μm, such as about 7 μm, although any suitable thickness may be used.

The IPS 102 also includes one or more v-shaped grooves 126, which are recesses shaped to hold fibers (e.g., fiber 124 of FIG. 1 or 2A). The v-shaped recesses 121 may be adjacent to a feature such as the power WG 120, data WG 122, or mode coupler 121 to allow optical coupling between a fiber 124 and the feature. In some embodiments, the v-shaped grooves 126 are formed in the IPS 102 prior to placement on the dielectric layer 306. In some embodiments, the v-shaped grooves 126 are formed having a length (e.g., a distance in the direction along the cross-section shown in FIG. 3B) between about 1 mm and about 10 mm. In some embodiments, the v-shaped grooves 126 have a depth between about 70 μm and about 110 μm. The v-shaped grooves 126 may be formed prior to formation of the protection layer 318 or after the protection layer 318 has been formed. For example, in some embodiments, the protection layer 318 is formed first, then a region of the protection layer 318 is removed to expose the surface of the IPS 102. The region of the protection layer 318 may be removed using, for example, a photolithographic patterning process, a laser drill, or another suitable technique. The v-shaped groove 126 may then be etched into the exposed surface of the IPS 102 using, for example, a dry etching process, a wet etching process, or a combination.

FIG. 3C illustrates the formation of a sacrificial material 320 over the v-shaped grooves 126. The sacrificial material 320 is deposited within the v-shaped grooves 126 to protect the v-shaped grooves 126 during subsequent processing steps. In some embodiments, the sacrificial material 320 is formed over the v-shaped grooves 126 by forming a photoresist over the structure, patterning an opening in the photoresist over the v-shaped grooves 126, depositing the sacrificial material 320 within the opening, and then removing the photoresist. The sacrificial material 320 may be a dielectric material, for example, a polymer material such as DAF (Die Attach Film), removable glue, epoxy, the like, another type of material, or a combination. In some embodiments, the sacrificial material 320 may be formed by a suitable technique such as CVD, PVD, spin-on, nano inkjet, or the like. In some embodiments, the sacrificial material 320 is formed protruding from the v-shaped grooves 126 or formed protruding above the protection layer 318.

Figure 3D:
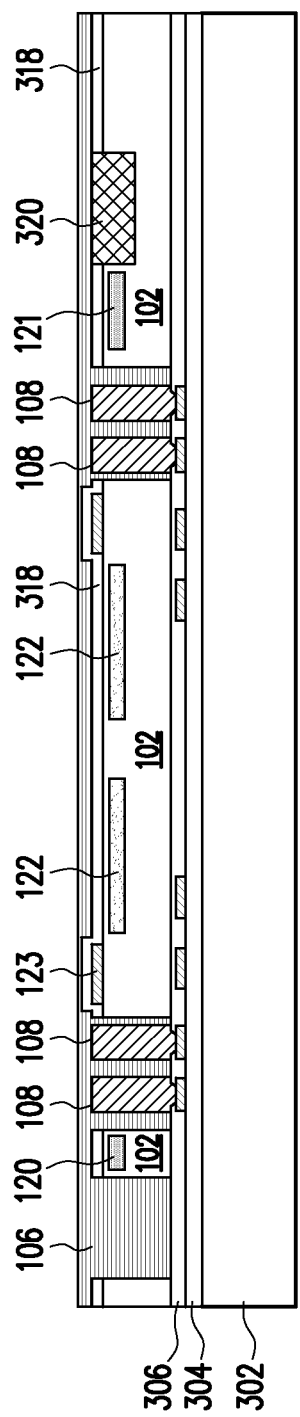

Referring to FIG. 3D, a molding compound 106 is formed surrounding the TVs 108. The molding compound 106 is deposited within the openings 104 of the IPS 102, and may be deposited over the TVs 108 or over the IPS 102. In some cases, the molding compound 106 is formed over the sacrificial material 320, and the sacrificial material 320 prevents the molding compound 106 from being formed within the v-shaped grooves 126. The molding compound 106 may be formed using CVD, a spin-on technique, or the like.

Figure 3E:
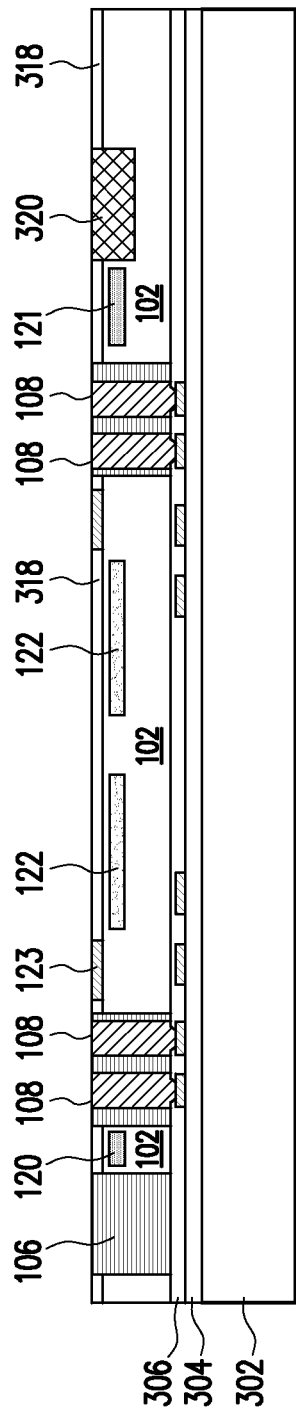

Turning to FIG. 3E, after depositing the molding compound 106, a planarization process (e.g., a chemical mechanical polish (CMP) process) may be performed to remove excess portions of the molding compound 106. The planarization process may also remove excess portions of the TVs 108, the protection layer 318, or the sacrificial material 320, and may expose top surfaces of the TVs 108, the protection layer 318, the sacrificial material 320, or the contact pads 123. In some embodiments, excess portions of the TV 108s, the protection layer 318, or the sacrificial material 320 are removed using a separate planarization process prior to planarization of the molding compound 106.

Figure 3F:
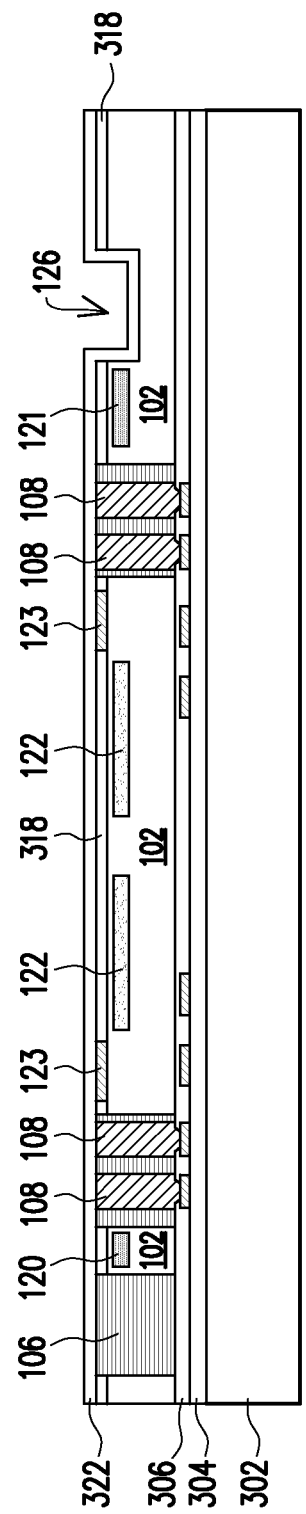

Turning to FIG. 3F, the sacrificial material 320 is removed and a dielectric layer 322 is then formed over the IPS 102, TVs 108, and molding compound 106. In some cases, the material of a sacrificial material 320 is able to be removed using techniques less likely to damage or etch the v-shaped grooves 126 than techniques to remove molding compound 106 if the molding compound were formed in the v-shaped grooves 126. For example, in embodiments in which the sacrificial material 320 is a polymer material, the polymer material may be removed using a laser drill instead of using additional photolithography or etching steps. In this manner, fewer process steps may be necessary than if the v-shaped grooves 126 were not protected by the sacrificial layer 320. In some embodiments, the sacrificial material 320 is not removed prior to forming the dielectric layer 322. An example process flow in which the sacrificial material 320 is not removed is described below for the embodiment shown in FIGS. 7A-I.

Still referring to FIG. 3F, a dielectric layer 322 is then formed over the IPS 102, TVs 108, and molding compound 106. The dielectric layer 322 may also be formed on surfaces of the v-shaped grooves 126, as shown in FIG. 3F. The dielectric layer 322 may be a material similar to that of dielectric layer 304, and may be formed in a similar manner. The dielectric layer 322 may have a thickness between about 4 µm and about 10 µm, such as about 7 µm, although any suitable thickness may be used.

Figure 3G:
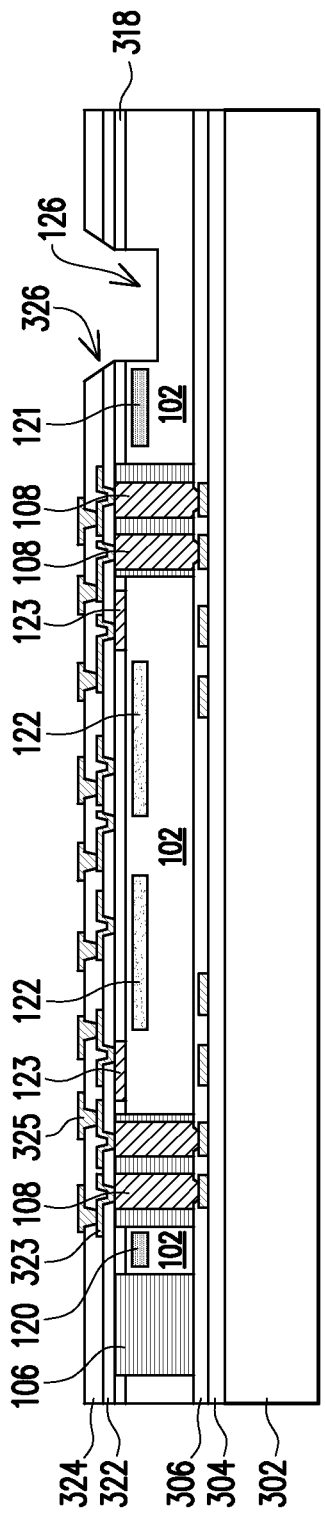

In FIG. 3G, RDL 323 and contact pads 325 are formed. Prior to forming the RDL 323, the dielectric layer 322 is patterned to expose the TVs 108 and contact pads 123. The dielectric layer 322 may be patterned using suitable photolithographic and etching techniques, such as forming a photoresist over the dielectric layer 322, patterning the photoresist, and then using the patterned photoresist as an etch mask to etch the dielectric layer 322. A suitable wet etch or dry etch may be used. In an embodiment, the RDL 323 may be formed similarly to the RDL 305, described previously. For example, a seed layer may be formed over the dielectric layer 322, a patterned photoresist may formed over the seed layer, a conductive material may be formed over the seed layer, and then the photoresist may be removed, the remaining portions of the conductive material forming RDL 323. A dielectric layer 324 may then formed over the RDL 323. The dielectric layer 324 may be a material similar to that of dielectric layer 304 or dielectric layer 322, and may be formed in a similar manner. The dielectric layer 324 may have a thickness about 4 µm and about 10 µm, such as about 7µ, although any suitable thickness may be used. In some embodiments, additional RDL and dielectric layers may be formed over the RDL 323. The additional RDL and/or dielectric layers may be formed in a similar manner to dielectric layer 322 and RDL 323.

Still referring to FIG. 3G, the dielectric layer 324 is patterned to expose portions of the RDL 323. The dielectric layer 324 may be patterned using suitable photolithographic and etching techniques, such as forming a photoresist over the dielectric layer 324, patterning the photoresist, and then using the patterned photoresist as an etch mask to etch the dielectric layer 324. A suitable wet etch or dry etch may be used. In an embodiment, the contact pads 325 may be formed similarly to the RDL 305 or RDL 323, described previously. For example, a seed layer may be formed over the dielectric layer 324, a patterned photoresist may formed over the seed layer, a conductive material may be formed over the seed layer, and then the photoresist may be removed, the remaining portions of the conductive material forming contact pads 325.

Still referring to FIG. 3G, an opening 326 is formed extending through the dielectric layers 322 and 324 and to remove material of the dielectric layers 322 and 324 within the v-shaped groove 126. In some embodiments, the opening 326 is formed by forming a photoresist over the dielectric layer 324 and then patterning an opening in the photoresist corresponding to the location of the opening 326. A suitable etching process such as a wet etching process or a dry etching process may be used to etch the dielectric layers 322 and 324, forming the opening 326. For example, an anisotropic dry etching process may be used. In some embodiments, the opening 326 has sloped sidewalls as shown in FIG. 3G, though the opening 326 may have vertical sidewalls in other embodiments. In some embodiments, a width of the opening 326 may be greater than a width of the v-shaped groove 126 such that the opening 326 exposes portions of the IPS 102 surrounding some of or all of the v-shaped groove 126. In some embodiments, the opening 326 may have a bottom width (e.g., at the bottom surface of the dielectric layer 322) between about 90 µm and about 150 µm or a top width (e.g., at the top surface of the dielectric layer 324) between about 90 µm and about 150 µm.

Figure 3H:
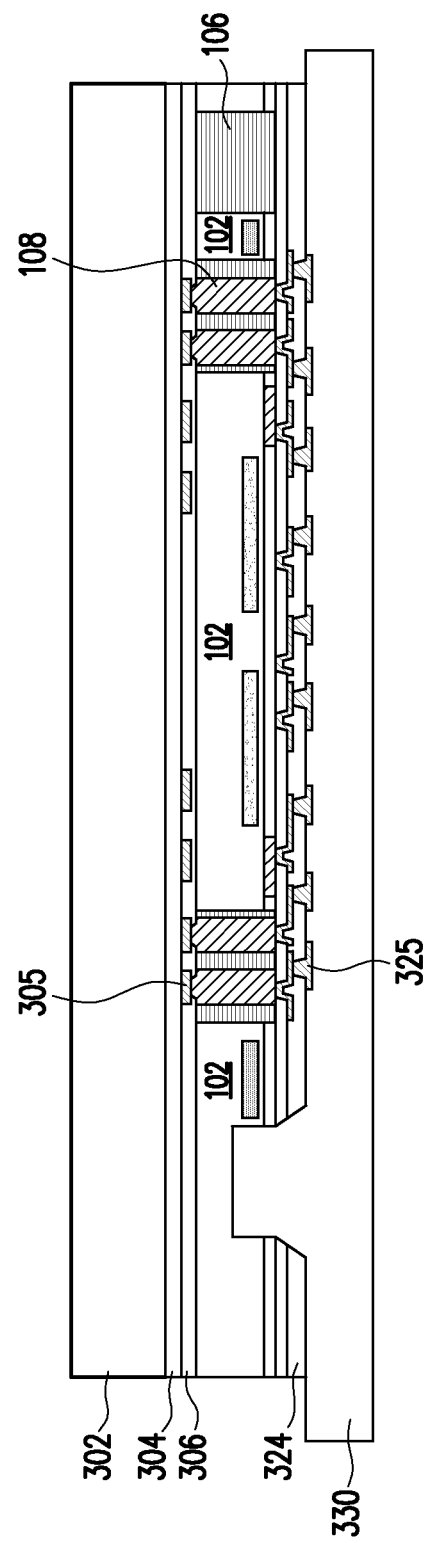

Turning to FIG. 3H, the structure is mounted to a tape 330, which may be an adhesive tape, die attach film, carrier, or the like. In some embodiments, the material of the tape 330 may at least partially fill the opening 326 or the v-shaped groove 126, as shown in FIG. 3H. The carrier substrate 302 is then debonded from the dielectric layer 304. For example, in embodiments in which a release layer is used to attach the carrier substrate 302 to the dielectric layer 304, the release layer may be decomposed by exposure to light (e.g., UV light) or heat, and then the carrier substrate 302 is separated from the dielectric layer 304.

In FIG. 3I, after removal of the carrier substrate 302, external connections 332 may be formed. Openings are formed in the dielectric layer 304 to expose the RDL 305, and then the external connections 332 are formed extending through the openings and electrically connecting the RDL 305. In an embodiment, the openings in the dielectric layer 304 may be patterned using, e.g., a laser drilling method. In some embodiments in which a laser drilling method is used, an optional protective layer such as a light-to-heat conversion (LTHC) layer or a hogomax layer (not separately illustrated in FIG. 3G) is first deposited over the dielectric layer 304. Once protected, a laser is directed towards those portions of the dielectric layer 304 which are desired to be removed in order to form the openings that expose the RDL 305. During the laser drilling process, the drill energy may be in a range from 0.1 mJ to about 30 mJ, and a drill angle of about 0 degree (perpendicular to the dielectric layer 304) to about 85 degrees to normal of the dielectric layer 304. In other embodiments, photolithographic and etching techniques may be used to pattern the dielectric layer 304.

In some embodiments, the external connections 332 may be formed over the openings in the dielectric layer 304 to provide an external connection to the RDL 305 and TVs 108. The external connections 332 may be contact bumps such as microbumps, solder bumps, or controlled collapse chip connection (C4) bumps and may include a material such as solder, tin, lead-free tin, copper, silver, the like, or a combination. In an embodiment in which the external connections 332 are solder bumps, the external connections 332 may be formed by initially forming a layer of solder through any suitable method such as evaporation, electroplating, printing, solder transfer, ball placement, etc., to a thickness of, e.g., about 170 µm. Once a layer of solder has been formed on the structure, a reflow may be performed in order to shape the solder material into the desired bump shape.

In FIG. 3J, the structure is attached to a carrier structure 340. The carrier structure 340 may be, for example, a frame, metal ring, or the like that is intended to provide support and stability for the structure during and after the debonding process. In an embodiment, the structure is attached to the carrier structure 340 using an adhesive 342. The adhesive 342 may be an adhesive tape, die attach film, ultraviolet-release tape, or the like, although any other suitable adhesive or attachment may alternatively be used. Once the structure is attached to the carrier structure 340, the tape 330 may be debonded from the structure.

Figure 3K:
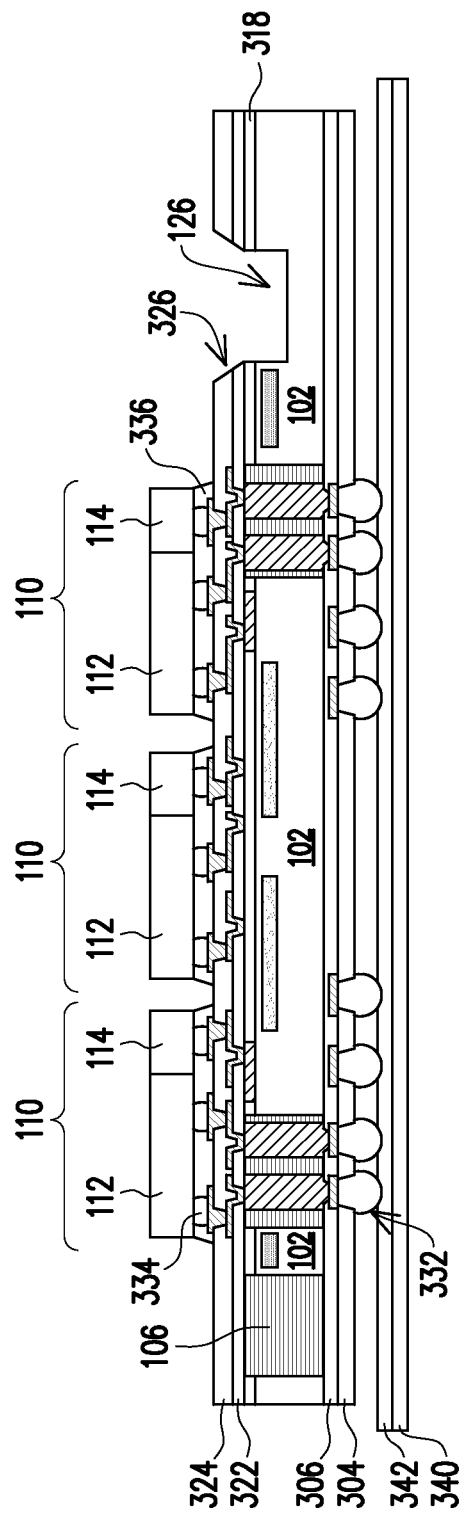

Turning to FIG. 3K, processor dies 112 and EICs 114 are mounted to the contact pads 325. As shown in FIG. 3K, each site 110 may include one or more processor dies 112 and one or more EICs 114. In some embodiments, the processor dies 112 or EICs 114 are placed using, for example, a pick-and-place process. The processor dies 112 or EICs 114 may be connected to the contact pads 325, for example, by optionally dipping connectors 334 (e.g., conductive bumps, contact pads, solder balls, etc.) of the processor dies 112 or EICs 114 into flux, and then using a pick-and-place tool in order to physically align the connectors 334 of the processor dies 112 or EICs 114 with corresponding contact pads 325. In some cases, a reflow may be performed to bond the connectors of the processor dies 112 or EICs 114 to the contact pads 325. An underfill 336 may be formed between the processor dies 112 or EICs 114 of a site 110 and the dielectric layer 324. In some cases, the underfill 336 may surround the connectors 334. In an embodiment, the underfill 336 may be a material such as a molding compound, an epoxy, an underfill, a molding underfill (MUF), a resin, or the like. In some embodiments, the underfill 336 may be a material that is optically transparent (or relatively transparent) to a wavelength of light used for optical communications within the IPS 102.

Figure 3L:
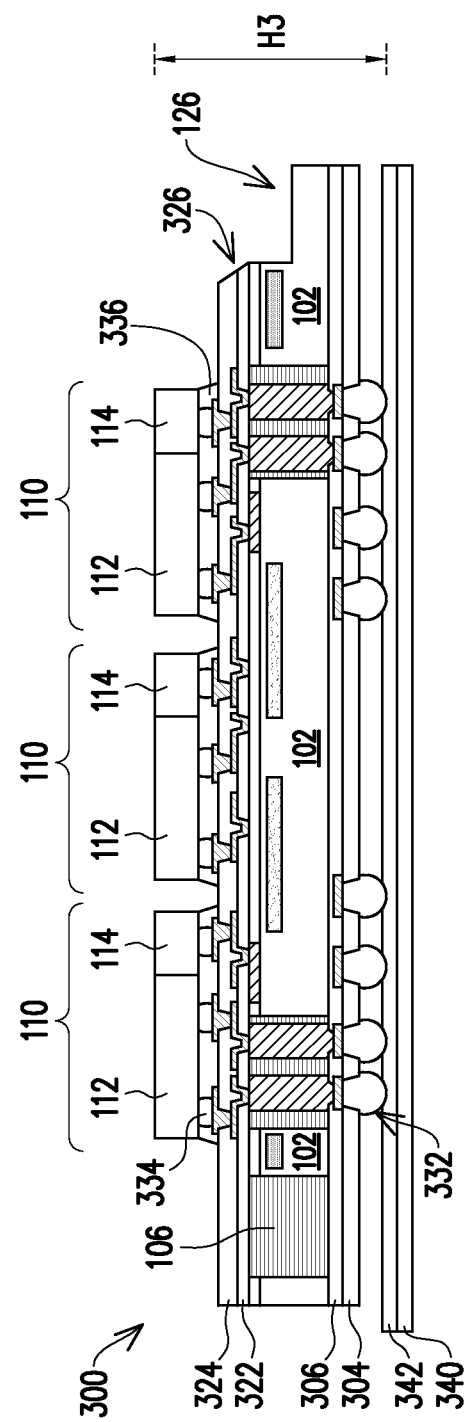
Figure 3M:
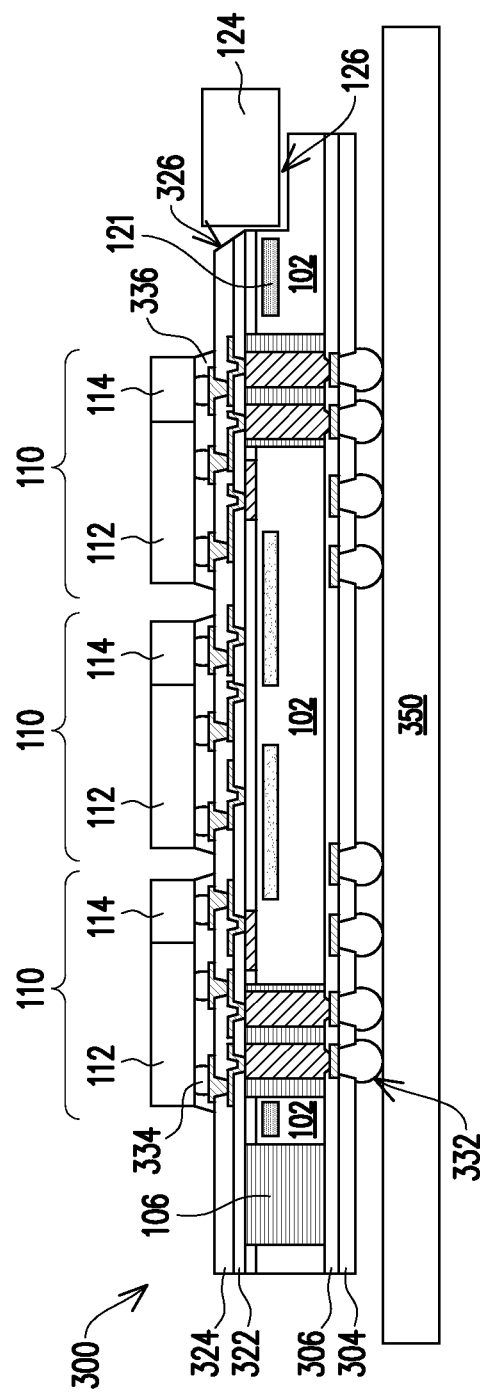

In FIGS. 3L-M, a singulation process is performed on the structure, forming the photonics system 300. The singulation process may be, for example, a sawing process. In some embodiments, the opening 326 or the v-shaped groove 126 extends into a scribe line region, and the singulation process cuts through a portion of the opening 326 or v-shaped groove 126 within the scribe-line region. In some embodiments, the singulation process cuts through the v-shaped grooves 126 such that one end of the v-shaped groove 126 is open. In some embodiments, after singulation, the v-shaped groove 126 has a length between about 500 µm and about 2 mm. In some embodiments, the photonics system 300 may have a thickness H3 that is between about 1 mm and about 3 mm.

FIG. 3M illustrates a cross-sectional view of the photonics structure 300 aligned with a fiber 124, similar to cross-section A-A' labeled in FIG. 1, above. As shown in FIG. 3M, one or more fibers 124 are mounted into the v-shaped grooves 126 of the IPS 102. A fiber 124 may be mounted in each v-shaped groove 126 such that the fiber 124 is aligned to be optically coupled to a waveguide (e.g., 120 or 122) or to a mode coupler 121. As shown in FIG. 3M, in some embodiments, the photonics system 300 is attached to a package substrate 350 to form a photonics package. The package substrate 350 may include or be connected to additional photonic or electronic components. The external connections 332 of the photonics system 300 may be electrically connected to the package substrate 350.

The photonics system 300 described in FIGS. 3A-M may achieve some advantages. In some cases, the use of TVs 108 formed within openings 104 as described herein may allow for improved electrical connection to the photonics system 300. For example, electrical signals transmitted through the TVs 108 to or from components of the photonics system 300 (e.g., to or from processor dies 112 or EICs 114) may have improved signal-to-noise and may have less signal loss at higher frequencies. The use of TVs 108 may also reduce the overall path length over which some electrical signals are transmitted, which can further improve signal-to-noise of the signals and reduce power consumption. Additionally, the use of sacrificial material 320 to protect the v-shaped grooves 120 may decrease the number of processing steps required, as the sacrificial material 320 may be easier to remove than other materials. In some cases, by selecting a molding compound 106 that has a coefficient of thermal expansion (CTE) similar to the material of a package substrate 350, the chance of warping or cracking can be reduced. Additionally, the formation of additional or more numerous openings 104 within the IPS 102 and filling the openings 104 with the molding compound 106 can improve the matching of CTE between the photonics system 300 and the package substrate 350 and further reduce warping or cracking.

Figure 4:
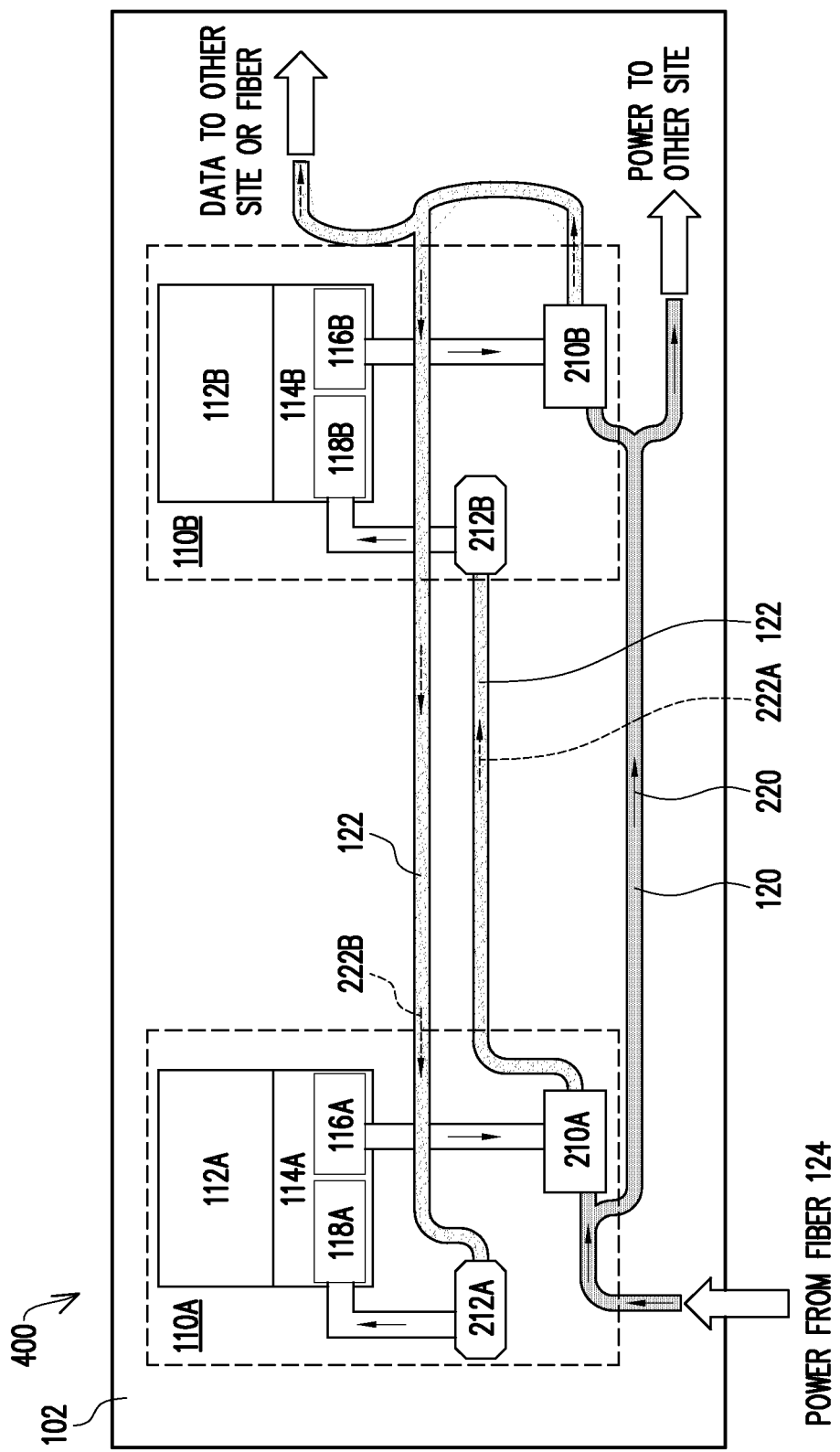
FIG. 4 illustrates a schematic diagram of a photonics system, in accordance with some embodiments

Turning to FIG. 4, a schematic diagram of a portion of a photonics system 400 is shown. The photonics system 400 may be similar to photonics system 100 shown in FIG. 1 or 2A-B, photonics system 300 shown in FIGS. 3L-M, or other photonics systems described herein. The schematic diagram shown in FIG. 4 illustrates optical communication between two sites 110A and 110B, which may be similar to sites 110 described previously. Site 110A includes a processor die 112A and an EIC 114A. The site 110A also includes an optical modulator 210A and a photodetector 212A that are formed in the IPS 102 of the photonics system 400. The EIC 114A includes a driver circuit 116A that is electrically coupled to the modulator 210A and is configured to control the modulator 210A by sending electrical signals to the modulator 210A. The EIC 114A also includes a trans-impedance amplifier circuit (TIA) 118A that is electrically coupled to the photodetector 212A and is configured to receive electrical signals from the photodetector 212A and process the signals. The TIA 118A may, for example, amplify current signals by converting them to voltage signals, or may amplify voltage signals by converting them to current signals. Site 110B includes a processor die 112B, an EIC 114B including a driver 116B and a TIA 118B, a modulator 210B, and a photodetector 212B, each of which may be similar to corresponding features of site 110A. Other configurations, features, arrangements, or combinations are also possible.

The IPS 102 of the photonics system 400 includes power WGs 120 that provide optical power 220 (e.g., in the form of continuous light) to each site 110A-B. In some embodiments, the optical power is provided by an external source (e.g., a laser source) and is transmitted to the power WGs 120 through a fiber (e.g., fiber 124 shown in FIG. 1) that is coupled to the power WG 120s (e.g., by mode converter 121 shown in FIG. 1). The IPS 102 also includes data WGs 122, portions of which extend between site 110A and site 110B and convey optical data signals 222A-B. As shown in FIG. 4, the power WGs 120 may also be connected to other sites and the data WGs 122 may also be connected to other sites or to external components (e.g., via a fiber).

In the embodiment shown in FIG. 4, the data WG 122s transmit data signals 222A from site 110A to site 110B. The data signals 222A may, for example, be modulated or pulsed light signals that represent data generated by the processor die 112A. To generate the modulated light of the data signals 222A, the optical power 220 is modulated as it is transmitted through the optical modulator 210A, which is coupled to both the power WGs 120 and the data WGs 122. The optical modulator 210A may, for example, alternately absorb or transmit optical power 220 according to electrical signals received from the driver 116A, thus generating the data signals 222A.

The data WGs 122 may be coupled to the photodetector 212B of site 110B such that the photodetector 212B receives the data signals 222A from site 110A. The photodetector 212B converts the data signals 222A from optical signals to electrical signals, which are transmitted to the TIA 118B. The TIA 118B converts and/or amplifies the electrical signals, which then may be transmitted to the processor die 112B and processed. Similarly, site 110B may communicate with site 110A by using the modulator 210B of site 110B to generate data signals 222B that are received by photodetector 212A of site 110A. In this manner, data signals 222A-B may be generated by one site and received by another site, allowing sites to communicate using the greater communication speed or bandwidth allowed by these photonic techniques.

Figure 5A:
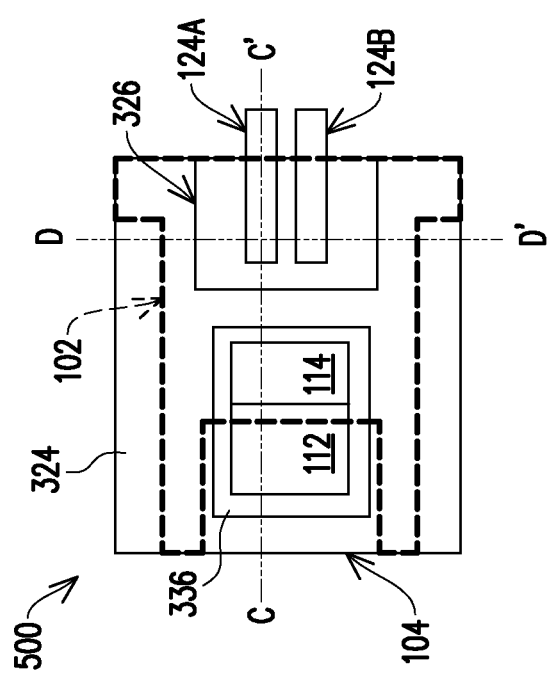
FIGS. 5A through 5C are various views of a photonics system, in accordance with some embodiments.
Figure 5B:
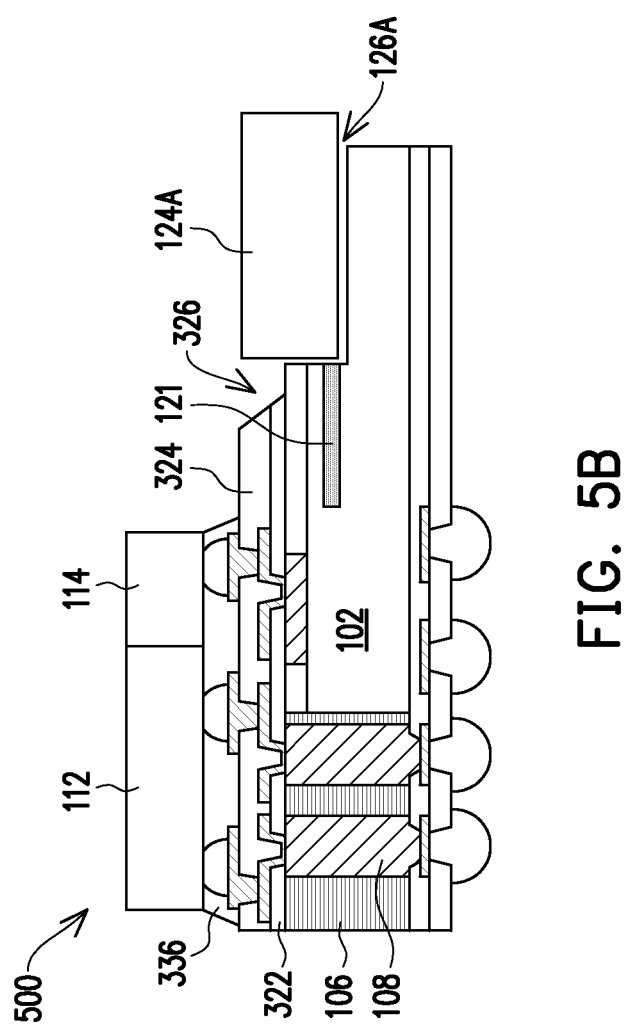
Figure 5C:
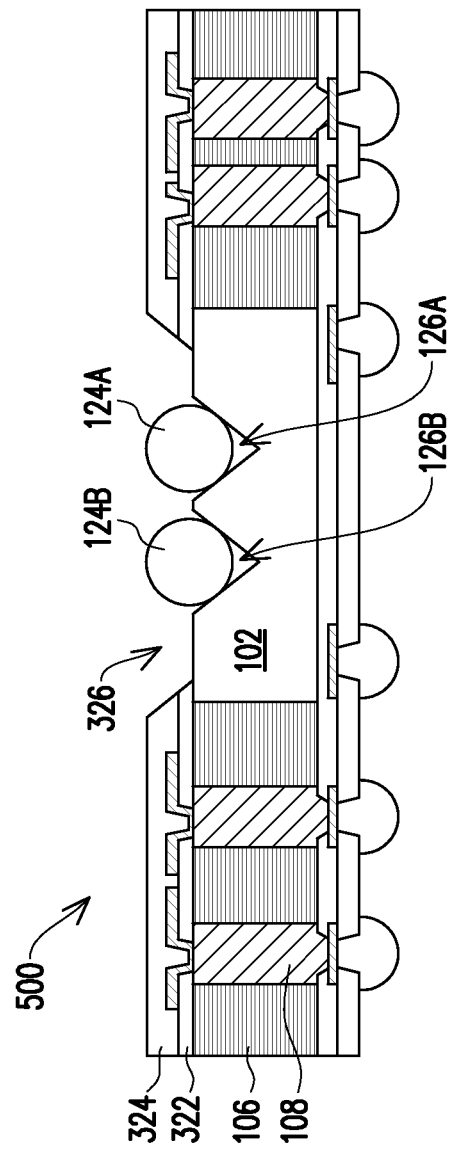

Turning to FIGS. 5A-C, a portion of a photonics system 500 is illustrated, according to an embodiment. The photonics system 500 may be similar to the photonics system 100 or photonics system 300 described earlier. In some embodiments, the photonics system 500 is formed using a process flow similar to that shown in FIGS. 3A-M. FIG. 5A shows a representative plan view, FIG. 5B shows a cross-sectional view through cross-section C-C' shown in FIG. 5A, and FIG. 5C shows a cross-sectional view through cross-section D-D' shown in FIG. 5C. In the photonics system 500 of FIGS. 5A-C, a processor die 112 and an EIC 114 are disposed above the IPS 102. FIGS. 5A-B show the processor die 112 and the EIC 114 as disposed directly over the IPS 102 and the TVs 108, but in other cases, the processor die 112 and/or the EIC 114 may be disposed in a different location relative to the IPS 102 or the TVs 108.

In the photonics system 500 shown in FIGS. 5A-C, two fibers 124A-B are mounted in two v-shaped grooves 126A-B, respectively. In other embodiments, only one fiber or more than two fibers may be present. In some embodiments, one or both of the fibers 124A-B may be configured to communicate optical power or data signals. The data signals may be transmitted to the photonics system 500 from an external component, or may be transmitted from the photonics system 500 to an external component. In some embodiments, the v-shaped grooves 126A-B may not be adjacent, and portions of the dielectric layers 322 and 324 may be disposed between the v-shaped grooves 126A-B. As shown in FIGS. 5A-C, the opening 326 in the dielectric layers 322 and 324 exposes the v-shaped grooves 126A-B, and the opening 326 may also expose regions of the IPS 102 around the v-shaped grooves 126A-B. For example, in some cases, an edge of the opening 326 may be offset from a v-shaped groove 126A-B between about 1 μm and about 2 μm.

Figure 6A:
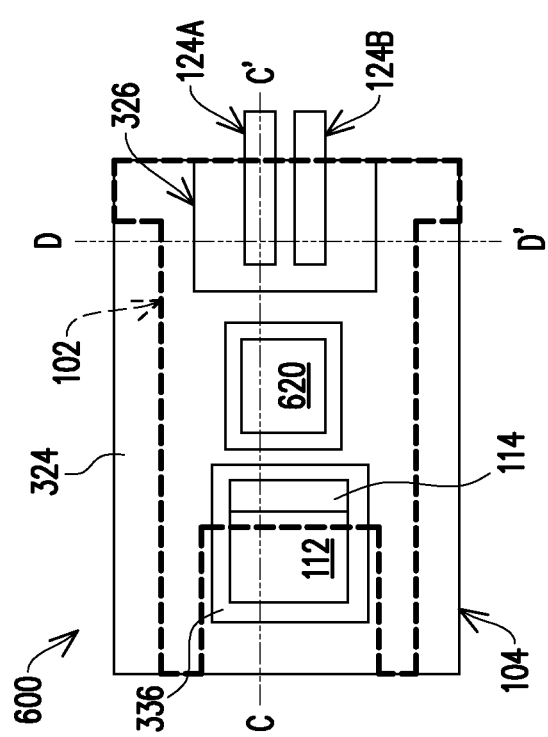
FIGS. 6A through 6C are various views of a photonics system, in accordance with some embodiments.
Figure 6B:
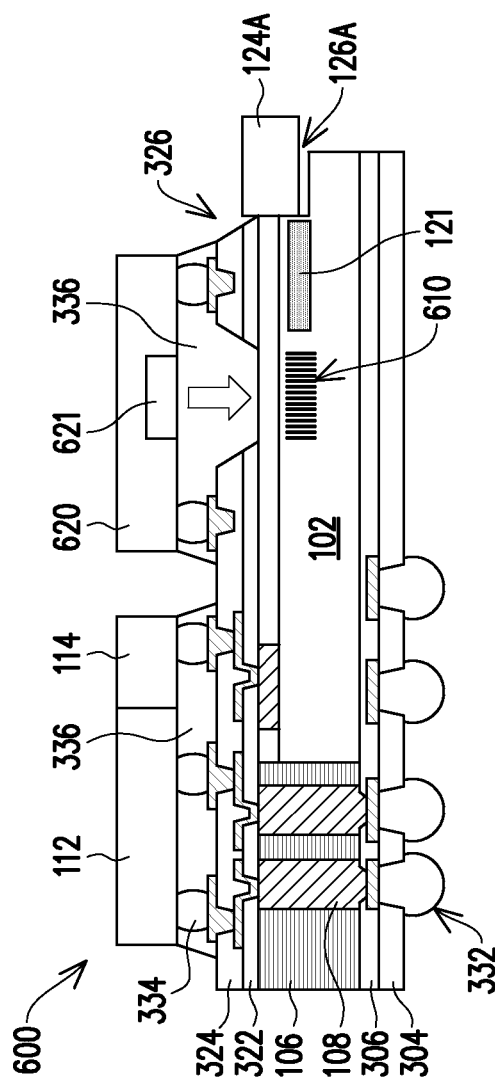
Figure 6C:
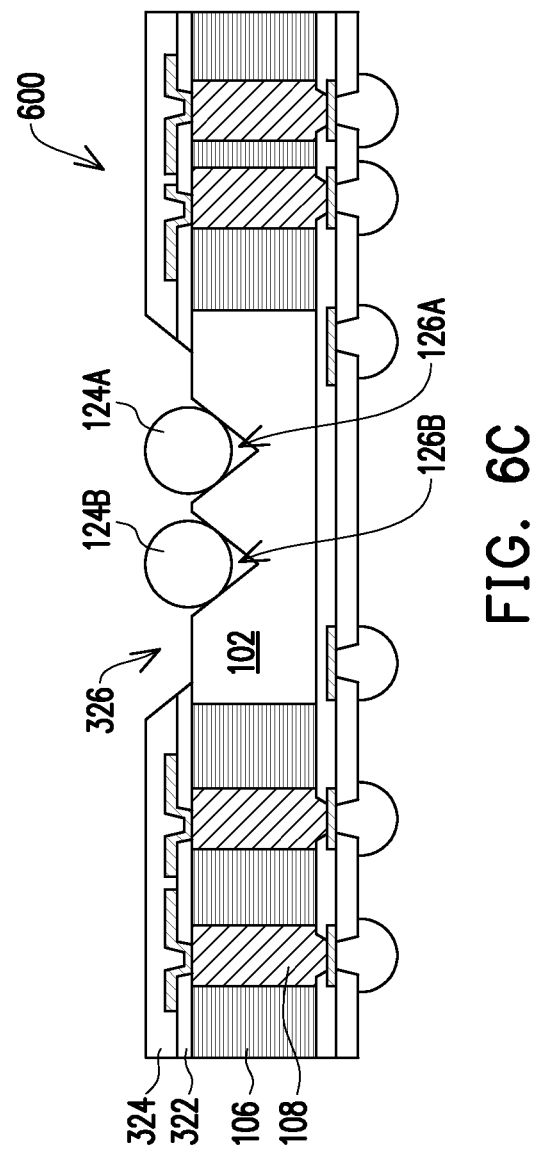

Turning now to FIGS. 6A-C, a portion of a photonics system 600 is illustrated, according to an embodiment. The photonics system 600 may be similar to the photonics system 500 described in FIGS. 5A-C or other photonics systems described herein. In some embodiments, the photonics system 600 is formed using a process flow similar to that shown in FIGS. 3A-M. FIG. 6A shows a representative plan view, FIG. 6B shows a cross-sectional view through cross-section C-C' shown in FIG. 6A, and FIG. 6C shows a cross-sectional view through cross-section D-D' shown in FIG. 6A.

In the photonics system 600 of FIGS. 6A-C, a processor die 112, an EIC 114, and a light source die 620 are disposed over the IPS 102. The IPS 102 shown in FIGS. 6A-C also includes a grating coupler 610 formed at or near the top surface of the IPS 102. In some embodiments, the IPS 102 may include more than one grating coupler 610. The grating coupler 610 is a photonic structure that is configured to receive light (e.g., optical power or optical signals) and couple the light into a waveguide or other photonic structure, such as a power WG 120 or a data WG 122.

In some embodiments, the light source die 620 is coupled to the IPS 102 via the grating coupler 610. The light source die 620 includes a light emitter 621 such as a laser (e.g., a semiconductor laser) or light-emitting diode (LED) that provides optical power or optical signals that can be transmitted to the IPS 102. By incorporating a light source die 620 within the photonics system 600, optical power may be provided to the photonics system 600 without the use of an external light source, such as an external light source that is coupled to the photonics system 600 using an optical fiber. In this manner, optical power may be more efficiently provided to the photonics system 600. Any suitable arrangement of TVs 108, processor dies 112, EICs 114, or light source dies 620 may be used. In some embodiments, the light source die 620 is electrically coupled to an EIC 114 or a processor die 112 (e.g., through the RDL 323), and signals may be transmitted between the light source die 620, the EIC 114, or the processor die 112. For example, the processor die 112 may send signals to the light source die 620 to control the operation of the light source die 620.

In the photonics system 600 shown in FIGS. 6A-C, two fibers 124A-B are mounted in two v-shaped grooves 126A-B, respectively. In other embodiments, only one fiber or more than two fibers may be present. In some embodiments, one or both of the fibers 124A-B may be configured to communicate optical power or data signals. The data signals may be transmitted to the photonics system 600 from an external component, or may be transmitted from the photonics system 600 to an external component. In some embodiments, the v-shaped grooves 126A-B may not be adjacent, and portions of the dielectric layers 322 and 324 may be disposed between the v-shaped grooves 126A-B. As shown in FIGS. 6A-C, the opening 326 in the dielectric layers 322 and 324 exposes the v-shaped grooves 126A-B, and the opening 326 may expose regions of the IPS 102 around the v-shaped grooves 126A-B. For example, in some cases, an edge of the opening 326 may be offset from a v-shaped groove 126A-B between about 1 μm and about 2 μm.

Turning to FIGS. 7A-I, cross-sectional views of intermediate steps in the formation of a photonics system 700 (see FIG. 7I) are shown, according to some embodiments. The photonics system 700 may be similar to photonics system 100 (see FIG. 1 or 2A-B), or other photonic systems described previously. Similar to the photonics system 600 described in FIGS. 6A-C, the photonics system 700 includes a light source die 620 that is coupled to the IPS 120 via a grating coupler 610. By incorporating a light source die 620 within the photonics system 700, optical power may be provided to the photonics system 700 more efficiently and without the use of an external light source.

In FIG. 7A, a redistribution layer (RDL) 305 and dielectric layers 304 and 306 are formed over a carrier substrate 302, and then through-vias (TVs) 108 are formed over the RDL 305. The carrier substrate 302 may be similar to the carrier substrate 302 described above with respect to FIGS. 3A-M. The RDL 305 and dielectric layers 304 and 306 may be similar to the RDL 305 and dielectric layers described above with respect to FIGS. 3A-M and may be formed in a similar manner. The TVs 108 may be similar to the TVs 108 described above with respect to FIGS. 2A-B or FIGS. 3A-M and may be formed in a similar manner.

Figure 7C:
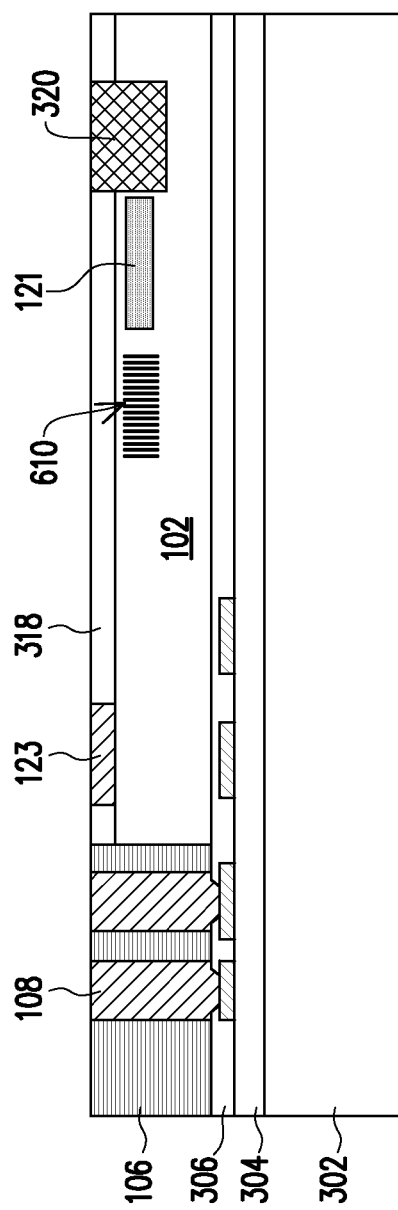

Turning to FIG. 7B, the IPS 102 is placed on the dielectric layer 306. In some embodiments, the IPS 102 is mounted to the dielectric layer 306 using an adhesive layer (not shown) disposed on the dielectric layer 306. As shown in FIG. 7B, the opening 104 in the IPS 102 is aligned to one or more TVs 108. The IPS 102 may include features described previously, such as waveguides (e.g., power WGs 120 or data WGs 122, not shown in FIGS. 7B-I) or mode converters 121. The IPS 102 shown in FIG. 7B also includes contact pads 123, which may provide electrical connection to features (e.g., photonic devices) formed in the IPS 102. The IPS 102 also includes one or more v-shaped grooves 126 and one or more grating couplers 610 formed at or near the top surface of the IPS 102. As shown in FIG. 7B, a protection layer 318 is formed over the IPS 102, leaving the v-shaped grooves 126 exposed. The IPS 102 may also include other features not shown, such as photonic devices, metal routing, etc.

FIG. 7C illustrates the formation of a sacrificial material 320 over the v-shaped grooves 126 and the formation of the molding compound 106 surrounding the TVs 108. The sacrificial material 320 is deposited within the v-shaped grooves 126 to protect the v-shaped grooves 126 during subsequent processing steps, and may be similar to the sacrificial material described previously with respect to FIG. 3C. The molding compound 106 is deposited within the openings 104 of the IPS 102, and may also be deposited over the TVs 108 or the IPS 102. The molding compound 106 may be similar to the molding compound 106 described previously with respect to FIG. 3C. In some cases, the molding compound 106 is formed over the sacrificial material 320, and the sacrificial material 320 prevents the molding compound 106 from being formed within the v-shaped grooves 126. In some cases, removal of the sacrificial material 320 within the v-shaped grooves 126 may use fewer process steps than removing the molding compound 106 if the molding compound 106 were formed within the v-shaped grooves 126. After depositing the molding compound 106, a planarization process may be performed to remove excess portions of the molding compound 106, and may expose top surfaces of the TVs 108, the sacrificial material 320, or the protection layer 318. In some embodiments, excess portions of the TV 108s, the protection layer 318, or the sacrificial material 320 are removed using a separate planarization process prior to planarization of the molding compound 106.

Figure 7D:
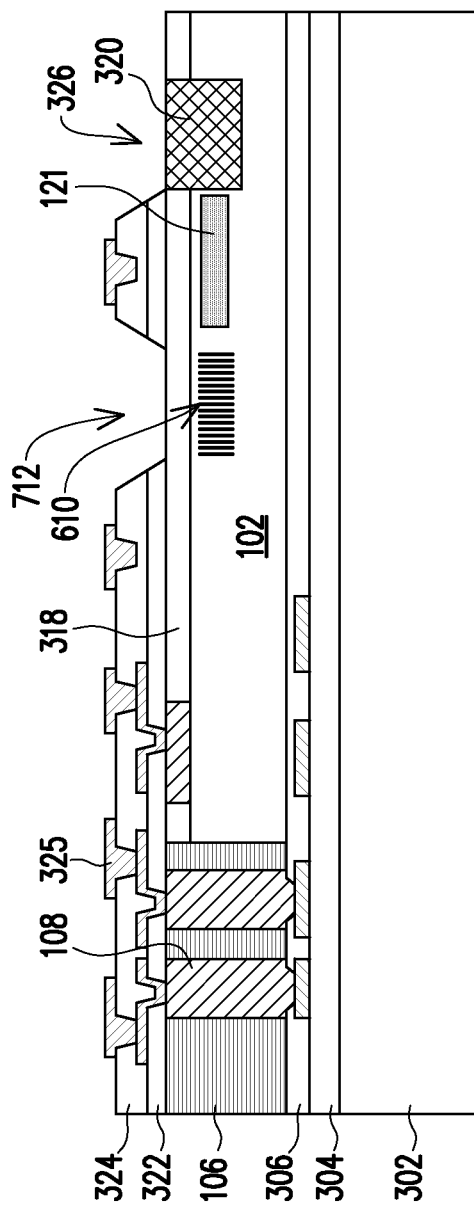

In FIG. 7D, a dielectric layer 322 is then formed over the IPS 102, sacrificial material 320, TVs 108, and molding compound 106. In other embodiments, the sacrificial material 320 is removed prior to forming the dielectric layer 322, similar to the process described in FIGS. 3E-F. An RDL 323 is formed over the dielectric layer 322 and contacting the TVs 108 or IPS 102. A dielectric layer 324 is formed over the dielectric layer 322 and RDL 323. The dielectric layer 322, RDL 323, or dielectric layer 324 may be similar to those described above with respect to FIGS. 3F-G, and may be formed in a similar manner.

Still referring to FIG. 7D, an opening 326 and an opening 712 are formed extending through the dielectric layers 322 and 324 to expose the sacrificial material 320 and the protection layer 318 above the grating coupler 610, respectively. In some embodiments, the opening 326 and the opening 712 are formed by forming a photoresist over the dielectric layer 324 and then patterning openings in the photoresist corresponding to the location of the opening 326 and the opening 712. A suitable etching process such as a wet etching process or a dry etching process may be used to etch the dielectric layers 322 and 324, forming the opening 326 and the opening 712. For example, an anisotropic dry etching process may be used. In some embodiments, the opening 326 and/or the opening 712 have sloped sidewalls as shown in FIG. 7D, though the opening 326 and/or the opening 712 may have vertical sidewalls in other embodiments. In some embodiments, the opening 326 is formed in a manner similar to that described above with respect to FIG. 3G.

Figure 7E:
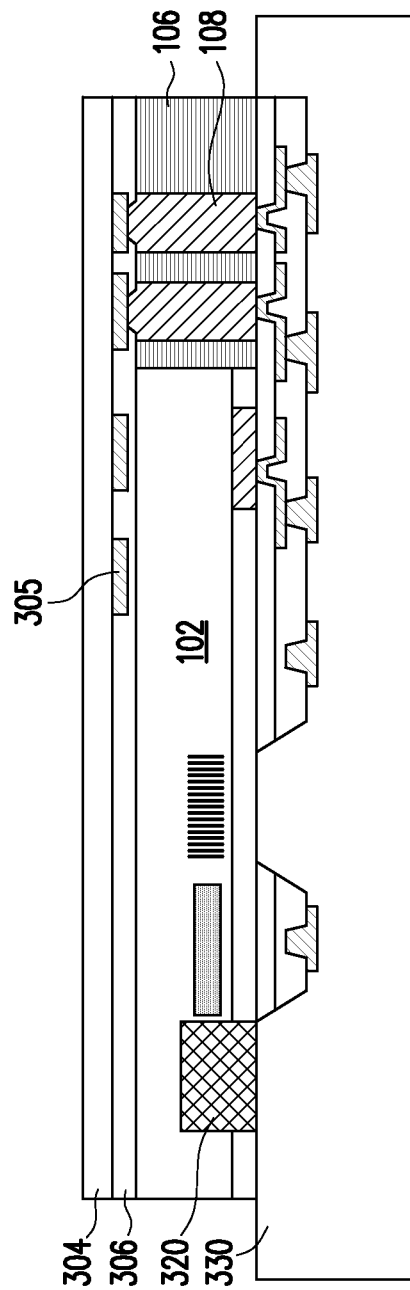

Turning to FIG. 7E, the structure is mounted to a tape 330, which may be an adhesive tape, die attach film, carrier, or the like. The carrier substrate 302 is then debonded from the dielectric layer 304. For example, in embodiments in which a release layer is used to attach the carrier substrate 302 to the dielectric layer 304, the release layer may be decomposed by exposure to light (e.g., UV light) or heat, and then the carrier substrate 302 is separated from the dielectric layer 304.

Figure 7F:
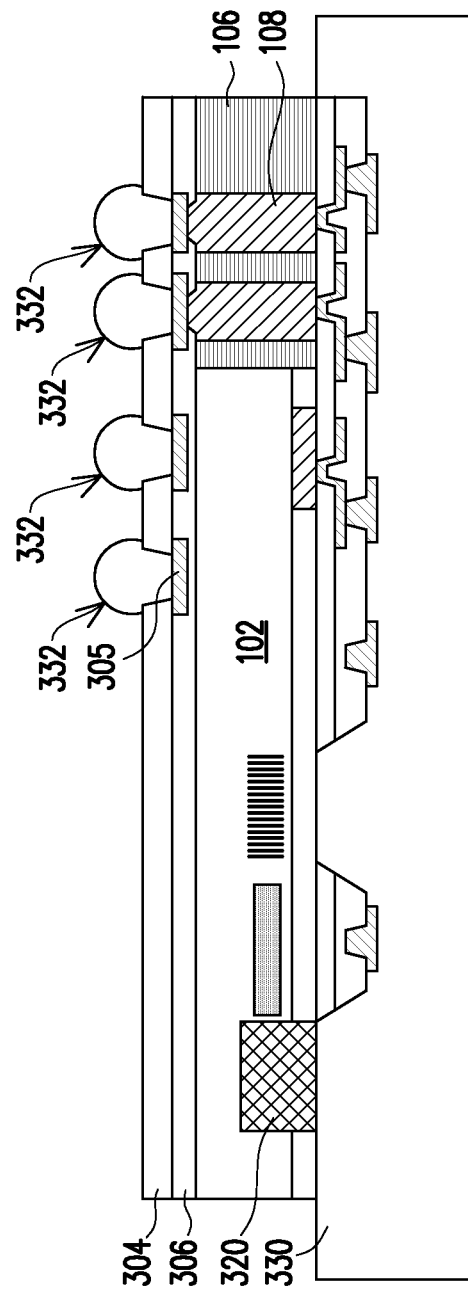

In FIG. 7F, external connections 332 are formed. Openings are formed in the dielectric layer 304 to expose the RDL 305, and then the external connections 332 are formed extending through the openings and electrically connecting the RDL 305. In an embodiment, the openings in the dielectric layer 304 may be patterned using, e.g., a laser drilling method, which may be similar to the method described above with respect to FIG. 3I. In some embodiments, the external connections 332 may be formed over the openings in the dielectric layer 304 to provide an external connection to the RDL 305 and TVs 108. The external connections 332 may be similar to those described previously with respect to FIG. 3I, and may be formed in a similar manner.

Figure 7G:
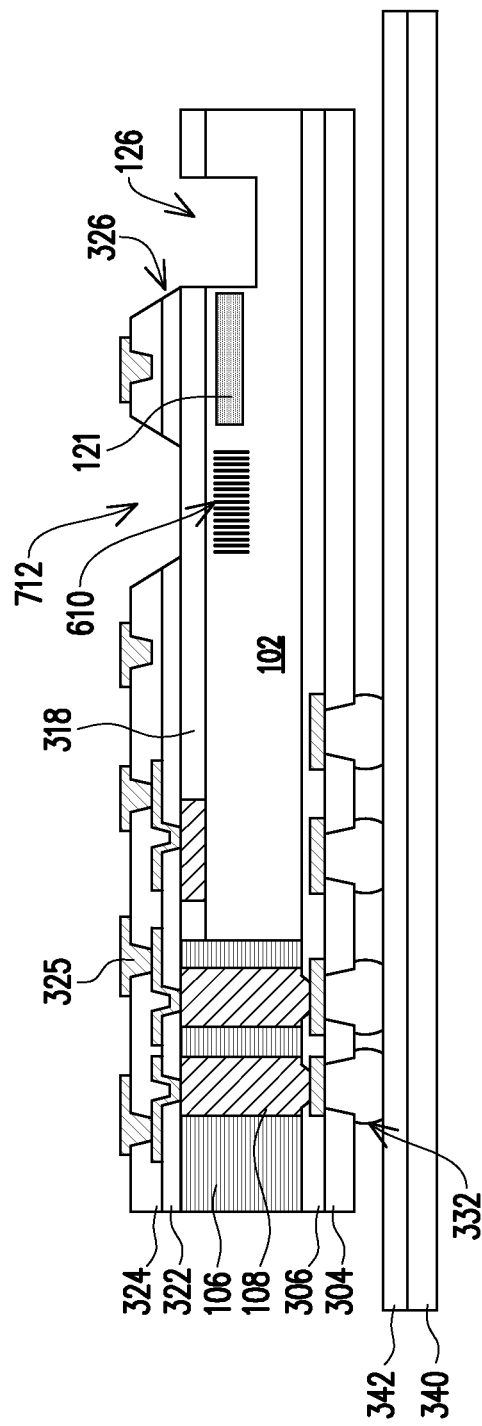

In FIG. 7G, the structure is attached to a carrier structure 340. The carrier structure 340 may be, for example, a frame, metal ring, or the like that is intended to provide support and stability for the structure during and after the debonding process. In an embodiment, the structure is attached to the carrier structure 340 using an adhesive 342. The carrier structure 340 or adhesive 342 may be similar to those described previously with respect to FIG. 3J.

Figure 7H:
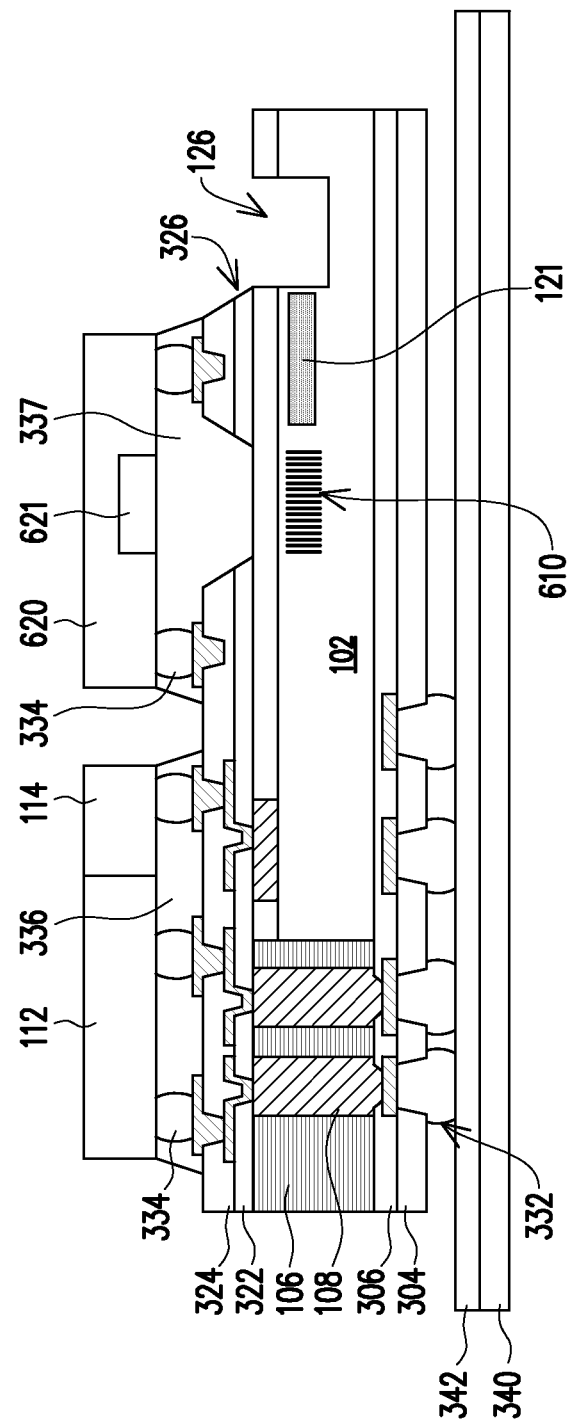

Turning to FIG. 7H, processor dies 112, EICs 114, and light source dies 620 are mounted to the contact pads 325. Each site 110 may include one or more processor dies 112 and one or more EICs 114. Each light source die 620 is mounted over a grating coupler 610, and aligned such that the light emitter 621 emits light toward the grating coupler 610. In some embodiments, processor dies 112, EICs 114, or light source dies 720 are placed using, for example, a pick-and-place process. The processor dies 112, EICs 114, or light source dies 620 may be connected to the contact pads 325, for example, by optionally dipping connectors 334 (e.g., conductive bumps, contact pads, solder balls, etc.) of the dies into flux, and then using a pick-and-place tool in order to physically align the connectors 334 with corresponding contact pads 325. In some cases, a reflow may be performed to bond the connectors 334 to the contact pads 325.

An underfill 336 may be formed between the processor dies 112 or EICs 114 of a site 110 and the dielectric layer 324. In some cases, the underfill 336 may surround the connectors 334. In an embodiment, the underfill 336 may be a material such as a molding compound, an epoxy, an underfill, a molding underfill (MUF), a resin, or the like. An optical underfill 337 may be formed between the light source die 620 and the grating coupler 610. In some embodiments, the optical underfill 337 may be a material that is optically transparent (or relatively transparent) to a wavelength of light used for optical communications within the IPS 102, or is a material otherwise chosen for its optical properties (e.g., refractive index). In this manner, the light emitted by the light emitter 621 may be transmitted through the optical underfill 337 to the grating coupler 610. The grating coupler 610 may be configured to transmit a portion of the light emitted by the light emitter 621 to another photonic structure, such as a waveguide, optical modulator, mode coupler, etc. In some embodiments, the underfill 336 and the optical underfill 337 are the same material.

Figure 7I:
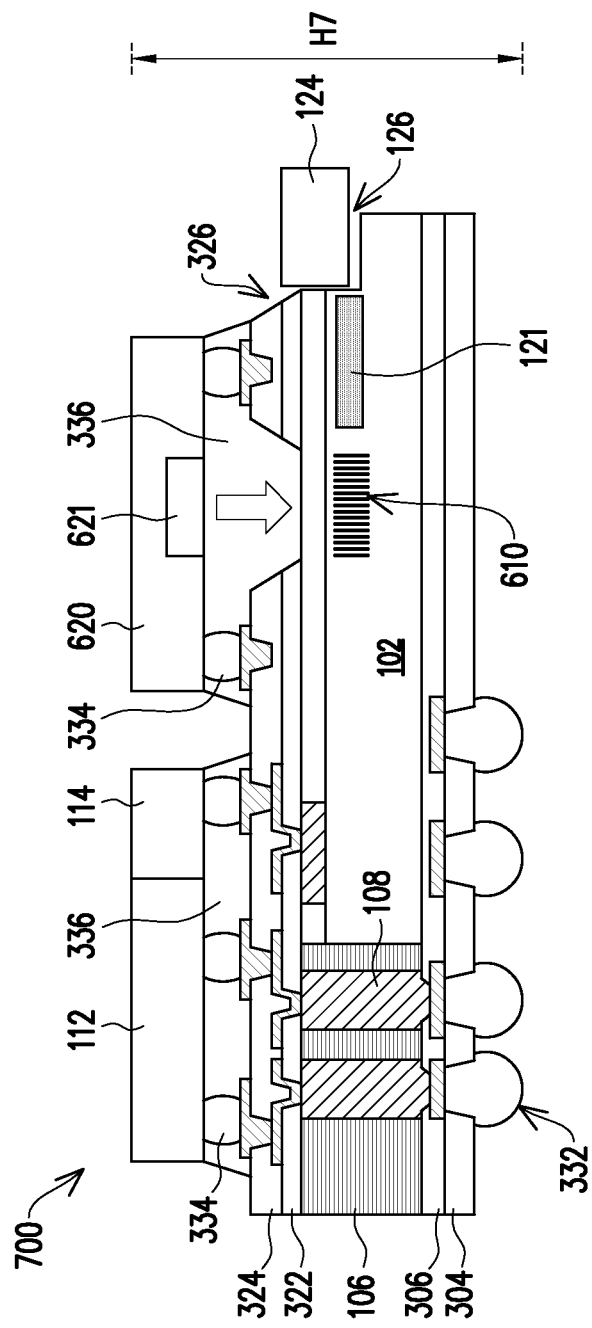

In FIG. 7I, a singulation process is performed on the structure, forming the photonics system 700. Additionally, one or more fibers 124 are mounted into the v-shaped grooves 126 of the IPS 102. FIG. 7I illustrates a cross-sectional view aligned with a fiber 124, similar to cross-section A-A' labeled in FIG. 1, above. In some embodiments, the singulation process cuts through the v-shaped grooves 126 such that one end of the v-shaped groove 126 is open. The singulation process may be, for example, a sawing process. In some embodiments, after singulation, the v-shaped groove 126 has a length between about 500 μm and about 2 mm. After singulation, a fiber 124 may be mounted in each v-shaped groove 126 such that the fiber 124 is aligned to be optically coupled to a waveguide or to a mode coupler 121. As shown in FIG. 7I, the EIC 114 and light source die 720 are disposed over the IPS 102. In some embodiments, the photonics system 700 may have a thickness H7 that is between about 1 mm and about 2 mm. In some embodiments, the photonics system 700 is attached to a package substrate (not shown), which may be similar to package substrate 350 described in FIG. 3M.

In some cases, the photonics system 700 described in FIGS. 7A-I may achieve some advantages. By mounting a source of optical power (e.g., a light source die 620) over the IPS 102 and coupled through a grating coupler 610, optical power may be more efficiently provided to the photonics system 700. For example, the optical power may be more efficiently coupled into power WGs 120 as continuous optical power or into data WGs 122 as modulated optical signals. Multiple sources of optical power may be coupled in this manner. This allows for increased flexibility of design in terms of the arrangement of components and increased flexibility in the design of how optical power is provided to the photonics system 700.

Figure 8A:
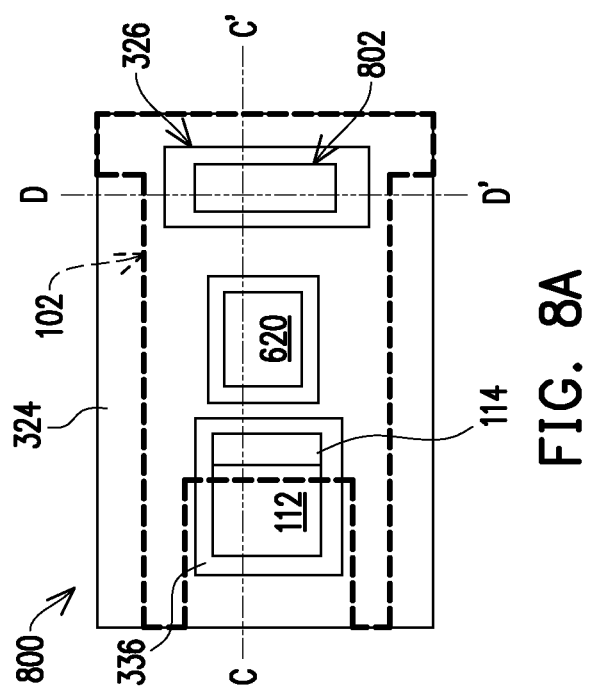
FIGS. 8A through 8C are various views of a photonics system, in accordance with some embodiments.
Figure 8B:
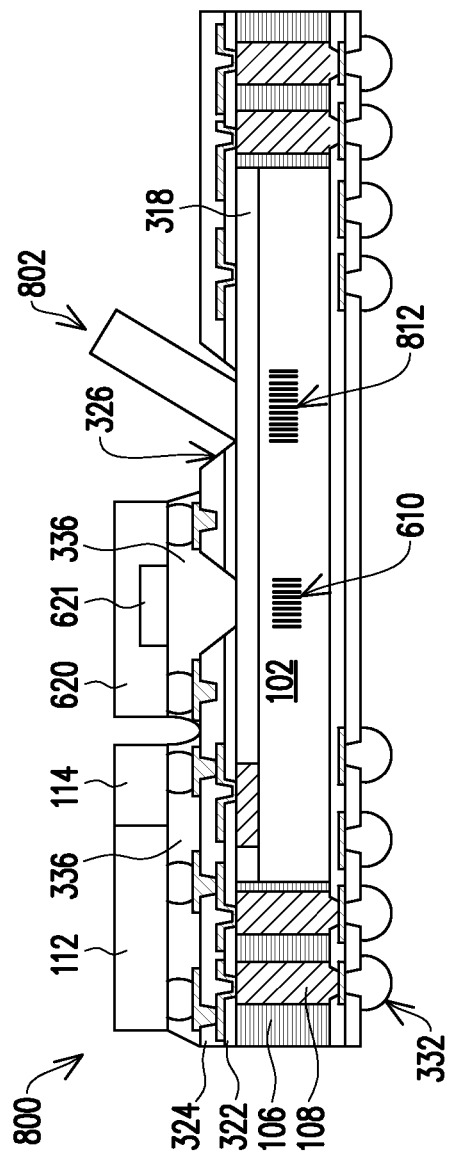
Figure 8C:
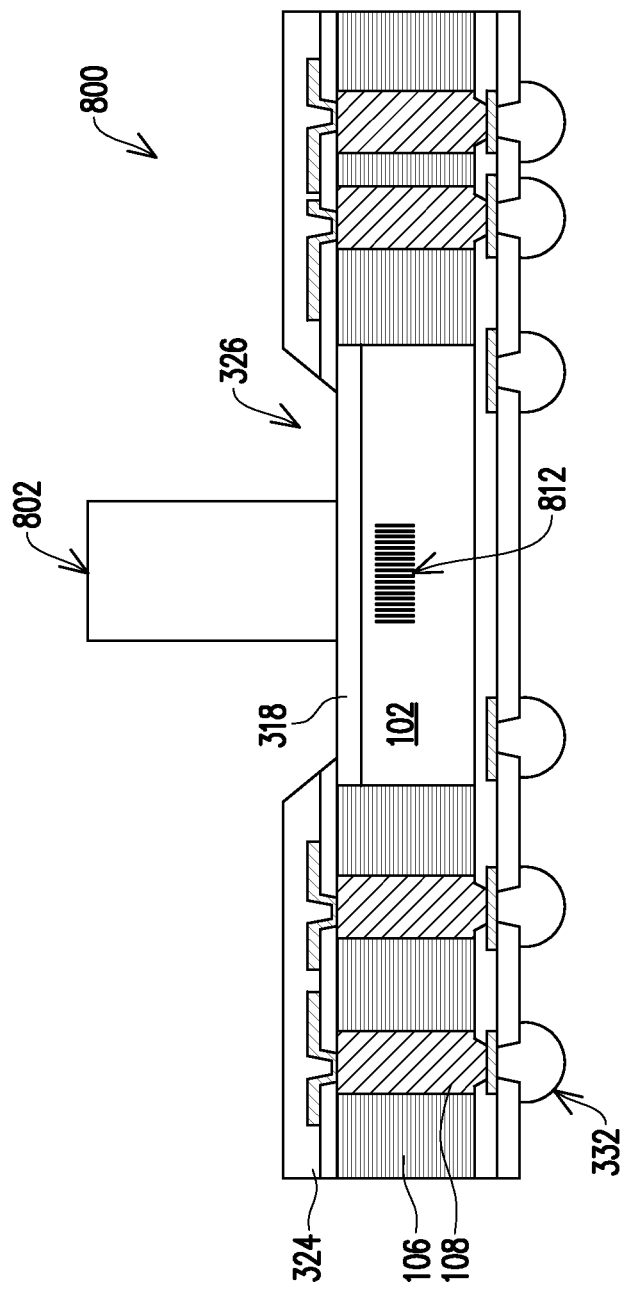

FIGS. 8A-C illustrate a portion of a photonics system 800, according to an embodiment. The photonics system 800 may be similar to the photonics system 700 described in FIG. 7I or another photonics system described herein, except that a fiber array 802 is used to send or receive optical power or optical signals. In some embodiments, the photonics system 800 is formed using a process flow similar to that shown in FIGS. 7A-I for the photonics system 700. FIG. 8A shows a representative plan view, FIG. 8B shows a cross-sectional view through cross-section C-C' shown in FIG. 8A, and FIG. 8C shows a cross-sectional view through cross-section D-D' shown in FIG. 8A. In the photonics system 800 of FIGS. 8A-C, a processor die 112, an EIC 114, and a light source die 620 are disposed over the IPS 102. Any suitable arrangement of TVs 108, processor dies 112, EICs 114, or light source dies 620 may be used. In some embodiments, the light source die 620 is electrically coupled to an EIC 114 or a processor die 112 (e.g., through the RDL 323), and signals may be transmitted between the light source die 620, EIC 114, or processor die 112. For example, the processor die 112 may send signals to the light source die 620 to control the operation of the light source die 620.

The light source die 620 is coupled to the IPS 102 through a grating coupler 610. In other embodiments, the light source die 620 may not be present. The fiber array 802 is optically coupled to the IPS 102 through one or more grating couplers 812, and may be, e.g., a polished fiber array. For example, a grating coupler 812 may couple optical power or optical signals between a waveguide of the IPS 102 and one or more fibers of the fiber array 802. An opening 326 is formed in dielectric layers 322 and 324 (see FIG. 7D, for example), and the fiber array 802 is mounted to the IPS 102 through the opening 326. In some embodiments, multiple fiber arrays 802 may be used. The arrangement of features of the photonics system 800 is merely illustrative, and any suitable arrangement of features may be used. For example, the fiber array 802 may be mounted at a suitable location away from the edge of the IPS 102. In some embodiments, a photonics system may be coupled to both a fiber array similar to those shown in FIGS. 8A-C and to a fiber similar to those shown in FIG. 1 or elsewhere herein.

In some cases, the photonics system 800 described in FIGS. 9A-C may achieve some advantages. By mounting a fiber array 802 over the IPS 102 and coupled through a grating coupler 812, the photonics system 800 may communicate with an external component through the fiber array 802. This allows for increased flexibility of design in terms of the arrangement of fiber arrays and components and increased flexibility in the design of how external components communicate with the photonics system 800.

Embodiments may achieve advantages. Through the use of multiple through-vias (TVs) disposed within an opening in an integrated photonic substrate (IPS), vias of a larger size may be formed than if individual vias were formed in individual openings in the IPS. The use of larger vias may allow for better electrical performance. For example, larger vias may have less resistance and may reduce signal loss, particularly at higher frequency operation. The TVs may be surrounded by a molding compound having a similar coefficient of thermal expansion (CTE) as the IPS, and thus reduce the chance of warping, cracking, or other problems associated with CTE mismatch. Additionally, the use of a sacrificial material (e.g., sacrificial material 320 or another polymer material) to protect the v-shaped grooves for fiber mounting can allow for an improved process. For example, the removal of the sacrificial material may be a process that is more reliable and less prone to IPS damage than, for example, patterning a molding compound or removing molding compound formed over the v-shaped grooves. The thickness of the photonics system may also be reduced by incorporating other dies within openings of the IPS. In some cases, this can also reduce the amount of metal routing distance between electrically connected components.

In an embodiment, a method includes forming a plurality of openings through a photonic substrate, wherein the photonic substrate includes a groove configured to receive an optical fiber, wherein the groove is formed in a top surface of the photonic substrate forming multiple through-vias over and electrically connected to a first redistribution structure, placing the photonic substrate over the first redistribution structure, wherein the multiple through-vias extend through the plurality of openings in the photonic substrate, forming a sacrificial material in the groove, forming a molding compound within the multiple openings in the photonic substrate, wherein the molding compound surrounds the multiple through-vias, forming a second redistribution structure over the top surface of the photonic substrate, wherein the second redistribution structure is electrically connected to the multiple through-vias and the photonic substrate, removing a portion of the second redistribution structure to expose the sacrificial material, removing the sacrificial material to expose the groove, and mounting an optical fiber within the groove. In an embodiment, the method includes performing a planarizing process on the molding compound to expose the sacrificial material. In an embodiment, the method includes placing multiple second semiconductor devices over and electrically connected to the second redistribution structure. In an embodiment, the method includes forming multiple waveguides within the photonic substrate. In an embodiment, the method includes forming multiple photonic devices within the photonic substrate, the multiple photonic devices optically coupled to the plurality of waveguides. In an embodiment, two or more through-vias of the multiple through-vias extend through the same opening in the photonic substrate. In an embodiment, the method includes forming an opening in the second redistribution structure, and placing a light source die on the second redistribution structure and extending over the opening in the second redistribution structure, the light source die configured to provide optical power to the photonic substrate. In an embodiment, the photonic substrate includes a semiconductor wafer. In an embodiment, the sacrificial material includes a polymer material.

In an embodiment, a method includes forming multiple photonic devices in a semiconductor wafer, forming a v-shaped groove in a first side of the semiconductor wafer, forming an opening extending through the semiconductor wafer, forming multiple conductive features within the opening, wherein the conductive features extend from the first side of the semiconductor wafer to a second side of the semiconductor wafer, forming a polymer material over the v-shaped groove, depositing a molding material within the opening, wherein the conductive features of the multiple conductive features are separated by the molding material, after depositing the molding material, removing the polymer material to expose the v-shaped groove, and placing an optical fiber within the v-shaped groove. In an embodiment, the method includes forming a redistribution layer over the semiconductor wafer, the redistribution layer electrically connected to the multiple photonic devices and electrically connected to the multiple conductive features. In an embodiment, the redistribution layer is formed after depositing the molding material and before removing the polymer material. In an embodiment, the method includes disposing an electronic integrated circuit (EIC) over the redistribution layer, wherein the EIC is electrically connected to the redistribution layer. In an embodiment, the method includes after removing the polymer material, sawing through the semiconductor wafer at the v-shaped groove. In an embodiment, the method includes forming an optical grating coupler in the first side of the semiconductor wafer. In an embodiment, removing the polymer material includes using a laser drill.

In an embodiment, a photonics system includes a photonic substrate including a set of waveguides formed in the photonic substrate, the set of waveguides optically coupled to at least one photonic device formed in the photonic substrate, a molding compound in a first region of the photonic substrate, the molding compound extending from a first side of the photonic substrate to a second side of the photonic substrate, at least one through-via extending through the molding compound from a first side of the molding compound to a second side of the molding compound, a redistribution structure disposed over the at least one through-via and the photonic substrate, the redistribution structure electrically coupled to the at least one through-via and the at least one photonic device, and at least one semiconductor device electrically coupled to the at least one photonic device by the redistribution structure. In an embodiment, the coefficient of thermal expansion of the material of the molding compound is about the same as the coefficient of thermal expansion of the material of the photonic substrate. In an embodiment, the at least one semiconductor device comprises a light source. In an embodiment, the photonic substrate includes at least one grating coupler configured to optically couple a fiber array to the set of waveguides.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a plurality of through-vias over a first substrate;
    placing a photonic substrate over the first substrate;
    forming a molding compound adjacent sidewalls of the photonic substrate, wherein the molding compound surrounds the plurality of through-vias;
    forming a first redistribution structure over the photonic substrate, wherein the first redistribution structure is electrically connected to the plurality of through-vias and the photonic substrate; and
    mounting an optical fiber to the photonic substrate.

2. The method of claim 1, wherein the photonic substrate comprises an opening, wherein at least one of the plurality of through-vias is in the opening.

3. The method of claim 1, wherein the first substrate comprises a second redistribution structure, wherein the plurality of through vias electrically couple conductive features of the first redistribution structure to conductive features of the second redistribution structure.

4. The method of claim 1, wherein the photonic substrate comprises a groove configured to receive an optical fiber.

5. The method of claim 4, wherein the groove is in a top surface of the photonic substrate.

6. The method of claim 5, further comprising:
    placing a sacrificial material in the groove prior to forming the molding compound; and
    removing the sacrificial material from the groove after forming the molding compound.

7. The method of claim 1, further comprising:
    attaching one or more semiconductor devices to the photonic substrate, wherein the first redistribution structure is between the one or more semiconductor devices and the photonic substrate.

8. A method comprising:
    forming a plurality of photonic devices on a semiconductor substrate;
    forming a groove in a first side of the semiconductor substrate;
    forming a sacrificial material over the groove;
    forming a plurality of conductive features on a carrier substrate;
    attaching the semiconductor substrate to the carrier substrate;
    depositing a molding material along sidewalls of the semiconductor substrate and the plurality of conductive features, wherein the conductive features of the plurality of conductive features are separated by the molding material; and
    after depositing the molding material, removing the sacrificial material to expose the groove.

9. The method of claim 8, wherein the sacrificial material comprises a polymer.

10. The method of claim 8, further comprising:
    forming an opening through the semiconductor substrate, wherein at least one of the plurality of conductive features protrude into the opening after attaching the semiconductor substrate to the carrier substrate.

11. The method of claim 8, wherein forming the sacrificial material is performed after attaching the semiconductor substrate to the carrier substrate.

12. The method of claim 8, further comprising, prior to removing the sacrificial material:
   forming a redistribution structure over the molding material, wherein the redistribution structure covers the sacrificial material; and
   removing a portion of the redistribution structure to expose the sacrificial material.

13. The method of claim 8, wherein the groove is a v-shaped groove.

14. A method, comprising:
   forming a photonic substrate, comprising forming at least one photonic device in a substrate and forming a set of waveguides in the substrate, wherein the set of waveguides is optically coupled to the at least one photonic device;
   forming a recess in the photonic substrate;
   filling the recess with a sacrificial material;
   forming a first redistribution structure on a carrier substrate;
   forming a first through via over the first redistribution structure;
   attaching the photonic substrate to the first redistribution structure;
   depositing a molding compound over the first redistribution structure and between the first through via and the photonic substrate, the molding compound extending from a first side of the photonic substrate to a second side of the photonic substrate;
   after depositing the molding compound, removing the sacrificial material from the recess; and
   forming a second redistribution structure over the first through via and the photonic substrate, wherein the second redistribution structure is electrically coupled to the first through via and the at least one photonic device.

15. The method of claim 14, wherein forming the photonic substrate further comprises:
   forming an opening through the photonic substrate, wherein after attaching the photonic substrate to the first redistribution structure, the first through via extends into the opening.

16. The method of claim 14, further comprising:
   after forming the molding compound and before forming the second redistribution structure, planarizing the molding compound to expose the sacrificial material.

17. The method of claim 16, wherein forming the second redistribution structure comprises forming the second redistribution structure over the sacrificial material, further comprising:
   removing portions of the second redistribution structure to expose the sacrificial material.

18. The method of claim 14, further comprising:
   attaching one or more semiconductor devices to the second redistribution structure, wherein the one or more semiconductor devices are electrically connected to the at least one photonic device by the second redistribution structure.

19. The method of claim 14, wherein the sacrificial material comprises a polymer.

20. The method of claim 14, wherein a coefficient of thermal expansion of the photonic substrate and the molding compound is in a range of 5 ppm/° C. and 30 ppm/° C.

* * * * *